US010714536B2

(12) United States Patent
Chen et al.

(10) Patent No.: US 10,714,536 B2
(45) Date of Patent: Jul. 14, 2020

(54) METHOD TO FORM MEMORY CELLS SEPARATED BY A VOID-FREE DIELECTRIC STRUCTURE

(71) Applicant: Taiwan Semiconductor Manufacturing Co., Ltd., Hsin-Chu (TW)

(72) Inventors: Hsia-Wei Chen, Taipei (TW); Wen-Ting Chu, Kaohsiung (TW); Yu-Wen Liao, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/266,259

(22) Filed: Feb. 4, 2019

(65) Prior Publication Data
US 2020/0127053 A1   Apr. 23, 2020

Related U.S. Application Data

(60) Provisional application No. 62/749,328, filed on Oct. 23, 2018.

(51) Int. Cl.
*H01L 29/06* (2006.01)
*H01L 27/24* (2006.01)
(Continued)

(52) U.S. Cl.
CPC .... *H01L 27/2463* (2013.01); *H01L 27/11507* (2013.01); *H01L 27/228* (2013.01);
(Continued)

(58) Field of Classification Search
CPC ............. H01L 27/2464; H01L 27/2436; H01L 27/11507; H01L 43/12; H01L 45/14
See application file for complete search history.

(56) References Cited

U.S. PATENT DOCUMENTS 8,557,712 B1   10/2013   Antonelli et al.
9,496,488 B2   11/2016   Kwon et al.
(Continued)

OTHER PUBLICATIONS

Liu et al. "PMD and STI Gap-Fill Challenges for Advanced Technology of Logic and eNVM." ECS Transactions, 52 (1) 397-402 (2013).
(Continued)

*Primary Examiner* — Phuc T Dang
(74) *Attorney, Agent, or Firm* — Eschweiler & Potashnik, LLC

(57) ABSTRACT

Various embodiments of the present application are directed towards an integrated chip comprising memory cells separated by a void-free dielectric structure. In some embodiments, a pair of memory cell structures is formed on a via dielectric layer, where the memory cell structures are separated by an inter-cell area. An inter-cell filler layer is formed covering the memory cell structures and the via dielectric layer, and further filling the inter-cell area. The inter-cell filler layer is recessed until a top surface of the inter-cell filler layer is below a top surface of the pair of memory cell structures and the inter-cell area is partially cleared. An interconnect dielectric layer is formed covering the memory cell structures and the inter-cell filler layer, and further filling a cleared portion of the inter-cell area.

20 Claims, 13 Drawing Sheets

(51) Int. Cl.
    *H01L 27/11507* (2017.01)
    *H01L 45/00* (2006.01)
    *H01L 43/12* (2006.01)
    *H01L 27/22* (2006.01)

(52) U.S. Cl.
    CPC .......... *H01L 27/2436* (2013.01); *H01L 43/12* (2013.01); *H01L 45/16* (2013.01)

(56) References Cited

U.S. PATENT DOCUMENTS

| | | | |
|---|---|---|---|
| 10,038,137 B2 | 7/2018 | Chuang et al. | |
| 2009/0001526 A1 | 1/2009 | Feustel et al. | |
| 2009/0050956 A1* | 2/2009 | Ishimaru | H01L 27/115 257/324 |
| 2017/0207387 A1 | 7/2017 | Yang et al. | |
| 2018/0019334 A1* | 1/2018 | Aubry | H01L 23/291 |
| 2018/0254248 A1* | 9/2018 | Kang | H01L 45/04 |
| 2019/0074440 A1* | 3/2019 | Yang | H01L 45/1253 |

OTHER PUBLICATIONS

Xiao, Hong. "Introduction to Semiconductor Manufacturing Technology, Second Edition—Chapter 10: CVD and Dielectric Thin Film." Published in 2012.

Dobkin, Daniel. "Plasma-Enhanced CVD From TEOS and Oxygen." Published in 2016. Retreived online on Jan. 10, 2019 from http://www.enigmatic-consulting.com/semiconductor_processing/CVD_Fundamentals/films/PECVD_TEOS.html.

Lam Research. "Thin Film Deposition: Gapfill." Published in 2013. Retrieved online on on Jan. 10, 2019 from https://www.silfex.com/Products_2_2_2.cfm.

* cited by examiner

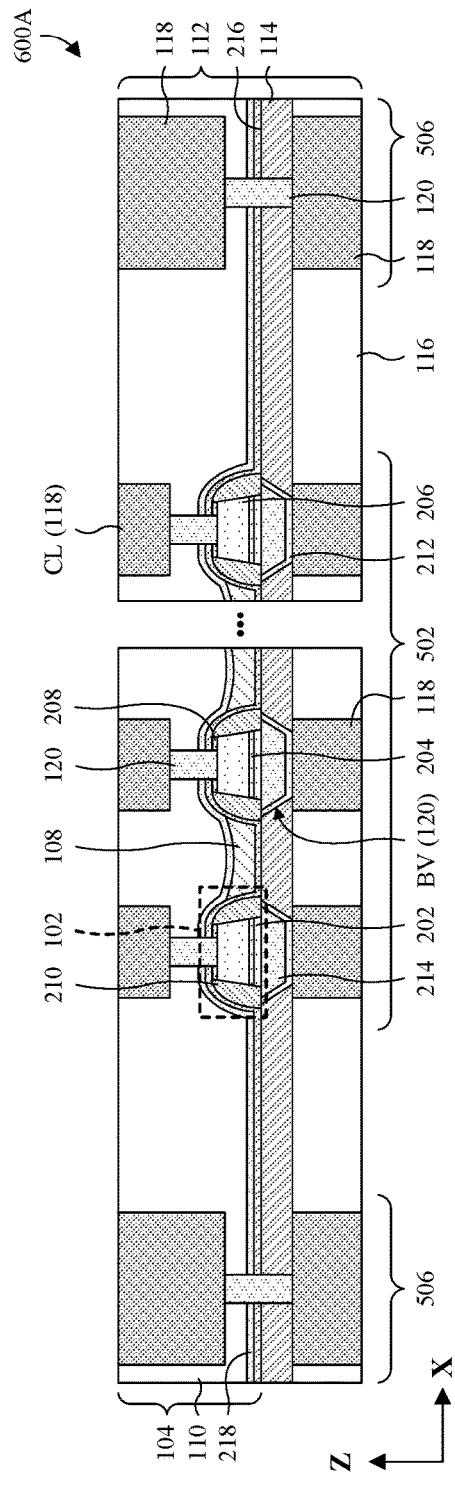
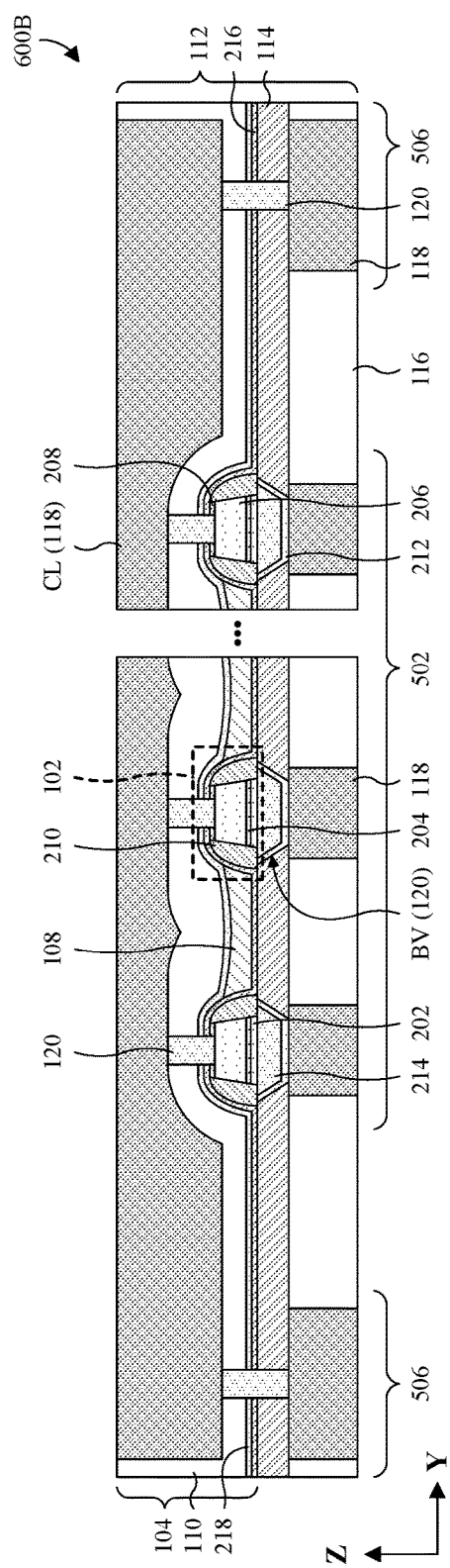
Fig. 6A
Fig. 6B

METHOD TO FORM MEMORY CELLS SEPARATED BY A VOID-FREE DIELECTRIC STRUCTURE

REFERENCE TO RELATED APPLICATION

This Application claims priority to U.S. Provisional Application No. 62/749,328, filed on Oct. 23, 2018, the contents of which are hereby incorporated by reference in their entirety.

BACKGROUND

Many modern-day electronic devices include non-volatile memory. Non-volatile memory is electronic memory that is able to store data in the absence of power. A promising candidate for the next generation of non-volatile memory is resistive random-access memory (RRAM). RRAM has a relatively simple structure, consumes a small cell area, has a low switching voltage, has fast switching times, and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A and 6B illustrate cross-sectional views of some embodiments of the integrated chip of FIG. 5.

DETAILED DESCRIPTION

Figure 1A:
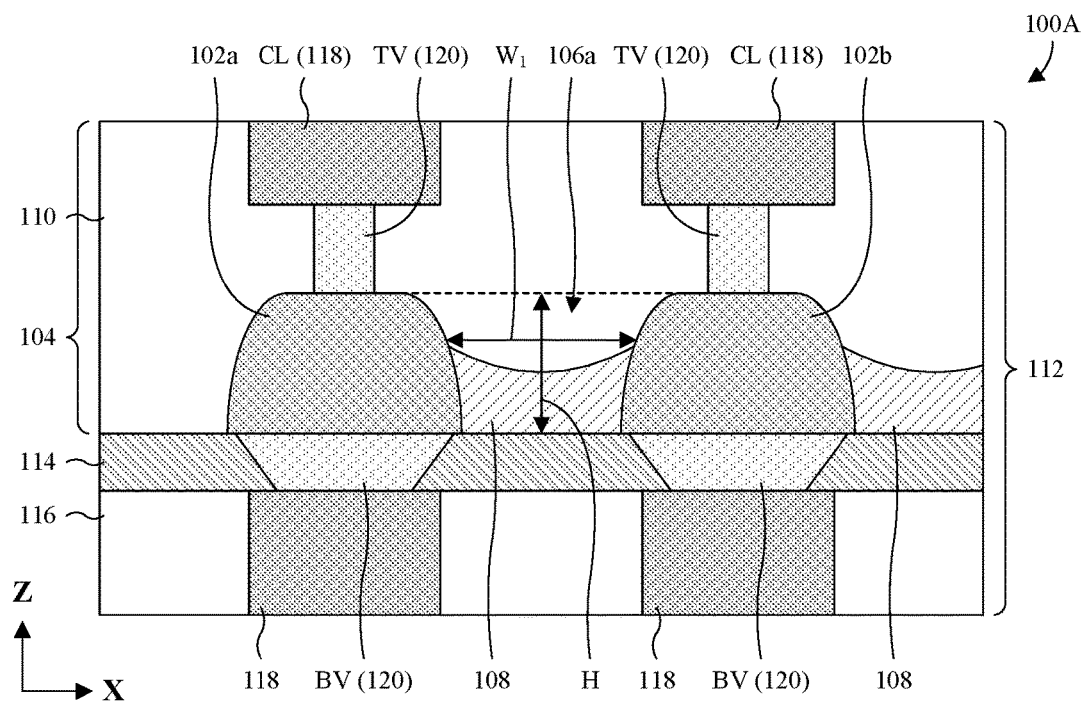
FIGS. 1A and 1B illustrate cross-sectional views of some embodiments of an integrated chip comprising memory cell structures separated by a void-free dielectric structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method for forming a resistive random-access memory (RRAM) array may, for example, comprise: forming a plurality of RRAM cell structures in a plurality of rows and a plurality of columns; depositing an interconnect dielectric layer covering the RRAM cell structures; and forming conductive lines inset into the interconnect dielectric layer and extending along individual columns of the RRAM array. The conductive lines electrically couple with top electrodes of RRAM cell structures in the individual columns and may, for example, be word lines or bit lines depending upon a memory architecture of the RRAM array. The interconnect dielectric layer may, for example, be or comprise an extreme low k (ELK) dielectric material or some other suitable dielectric material. An ELK dielectric material may, for example, have a dielectric constant less than about 2.5, 2.0, or some other suitable value.

A challenge with the method is that the interconnect dielectric layer has indents between neighboring RRAM cell structures because of the lower elevation between the neighboring RRAM cell structures. Because the bit lines are formed inset into the interconnect dielectric layer, the bit lines conform to the indents and hence have downward protrusions along the individual columns. The downward protrusions decrease in width from top to bottom and hence have bottom surfaces with small radiuses of curvature. The small radiuses of curvature increase electric field strength and hence increase the likelihood of dielectric breakdown. Another challenge with the method is that a row-wise pitch of the RRAM array is small and inter-cell areas separating RRAM cell structures along the rows have high aspect ratios (i.e., high ratios of height to width). Because of the high aspect ratios, the interconnect dielectric layer forms with voids at the inter-cell areas. The voids are electrically insulating but have a lower dielectric constant than the interconnect dielectric layer. Accordingly, the voids have a higher likelihood of dielectric breakdown than the interconnect dielectric layer. Further, the voids neighbor the downward protrusions and are hence at increased risk of dielectric breakdown due to the high electric field strength at the downward protrusions.

During use of RRAM cell structures, high voltages may be applied across the RRAM cell structures to set and reset the RRAM cell structures. The high voltages, the voids, the downward protrusions, and the ELK dielectric material may contribute to dielectric breakdown and hence leakage paths at the inter-cell areas. The leakage paths may extend from the conductive lines, and hence the top electrodes to the RRAM cell structures, to bottom electrodes of the RRAM cell structures through the downward protrusions, the interconnect dielectric layer, and the voids. The leakage paths may, in turn, lead to read and/or write disturbance and hence a decrease in reliability of the RRAM array.

Various embodiments of the present application are directed towards a method for forming an integrated chip comprising memory cells separated by a void-free dielectric structure. The memory cells may, for example, be RRAM cells or some other suitable memory cells. In some embodiments, the method comprises: forming a pair of memory cell structures, where the memory cell structures are separated by an inter-cell area having a high aspect ratio (HAR); forming an inter-cell filler layer covering the memory cell structures, and further filling the inter-cell area, where the inter-cell filler layer is formed by a HAR deposition process; recessing the inter-cell filler layer until an upper surface of the inter-cell filler layer is below an upper surface of the memory cell structures and the inter-cell area is partially cleared; and forming an interconnect dielectric layer covering the memory cell structures and the inter-cell filler layer, and further filling a cleared portion of the inter-cell area. A HAR may, for example, be a ratio of height to width greater than about 1:1, about 2:1, about 2.5:1.0, about 5:1, or some other suitable ratio. The HAR deposition process may, for example, be or comprise a high deposition rate (HDR) tetraethyl orthosilicate (TEOS) deposition process or some other suitable HAR and/or HDR deposition process. The interconnect dielectric layer may, for example, be or comprise an ELK dielectric material and/or some other suitable dielectric material(s).

Because the inter-cell filler layer is formed by the HAR deposition process, the inter-cell filler layer forms filling the inter-cell area without voids even though the inter-cell area has a HAR. After the recessing, the inter-cell filler layer partially fills the inter-cell area. Further, the cleared portion of the inter-cell area has a lower aspect ratio than an entirety of the inter-cell area. Because of this lower aspect ratio, the interconnect dielectric layer forms filling the cleared portion of the inter-cell area without voids. By preventing formation voids at the inter-cell area, the risk of dielectric breakdown at the inter-cell area is reduced. Dielectric breakdown at the inter-cell area has the potential to form leakage paths between top and bottom electrodes of the memory cell structures. Hence, reducing the likelihood of dielectric breakdown at the inter-cell area reduces the risk of read and/or write disturbance to the memory cell structures and increases the read and/or write reliability of the memory cell structures.

Because the process for forming and recessing the inter-cell filler layer can be performed without costly photomasks, voids can be prevented at the inter-cell area in a cost-effective manner. Further, because the process for preventing voids at the inter-cell area can be performed by an HDR TEOS deposition process and an etch back, the process is compatible with logic and/or complementary metal-oxide semiconductor (CMOS) manufacturing processes.

With reference to FIG. 1A, a cross-sectional view 100A of some embodiments of an integrated chip comprising a first memory cell structure 102a and a second memory cell structure 102b is provided. The first and second memory cell structures 102a, 102b are separated from each other by a void-free dielectric structure 104 that is free of voids at a first inter-cell area 106a between the first and second memory cell structures 102a, 102b. As used herein, a void may, for example, be a vacuum-sealed area and/or a gas-filled area. The void-free dielectric structure 104 comprises an inter-cell filler layer 108 and an upper interconnect dielectric layer 110. The inter-cell filler layer 108 and the upper interconnect dielectric layer 110 each partially fill the first inter-cell area 106a. Further, the upper interconnect dielectric layer 110 overlies the inter-cell filler layer 108 and the first and second memory cell structures 102a, 102b.

The first inter-cell area 106a has a HAR (i.e., a high ratio of height H to width $W_1$). The HAR may, for example, be about 1:1-5:1, about 1:1-2.5:1, about 2.5:1-5:1, or some other suitable ratio(s). Further, the HAR may, for example, be greater than about 1:1, about 2:1, about 2.5:1, about 5:1, or some other suitable ratio(s). Because of the HAR, the upper interconnect dielectric layer 110 would form, or would have a high likelihood of forming, with a void at the first inter-cell area 106a if the inter-cell filler layer 108 were omitted. However, because the inter-cell filler layer 108 partially fills the first inter-cell area 106a, a remainder of the first inter-cell area 106a has a low aspect ratio (LAR) compared to the entirety of the first inter-cell area 106a. Accordingly, the upper interconnect dielectric layer 110 forms without, or has a high likelihood of forming without, a void at the first inter-cell area 106a.

As seen hereafter, the inter-cell filler layer 108 is formed by a HAR deposition process so the inter-cell filler layer 108 does not form with a void at the first inter-cell area 106a. In some embodiments, the inter-cell filler layer 108 is or comprises TEOS oxide and/or the HAR deposition process is or comprises an HDR TEOS deposition process. Other material(s) and/or other HAR deposition process(es) is/are, however, amenable. The HDR TEOS process may, for example, have a high deposition rate at least about 3, 5, or 10 times greater than that of the upper interconnect dielectric layer 110. Other values are, however, amenable.

By forming the upper interconnect dielectric layer 110 and the inter-cell filler layer 108 without voids at the first inter-cell area 106a, the likelihood of dielectric breakdown at the first inter-cell area 106a is reduced. A void in the upper interconnect dielectric layer 110 and/or the inter-cell filler layer 108 is electrically insulating but has a lower dielectric constant than the upper interconnect dielectric layer 110 and the inter-cell filler layer 108. Hence, the void is more prone to dielectric breakdown than the upper interconnect dielectric layer 110 and the inter-cell filler layer 108. Accordingly, eliminating voids at the first inter-cell area 106a reduces the likelihood of dielectric breakdown at the first inter-cell area 106a.

Dielectric breakdown at the first inter-cell area 106a has the potential to form leakage paths from bottom electrodes (not shown) of the first and second memory cell structure 102a, 102b to conductive lines CL. The conductive lines CL respectively overlie the first and second memory cell structures 102a, 102b and are electrically coupled to top electrodes (not shown) of the first and second memory cell structures 102a, 102b by top electrode vias TV. The conductive lines CL may be bit lines or word lines depending upon a memory architecture of the first and second memory cell structures 102a, 102b. For example, the conductive lines CL may be word lines when the first and second memory cell structures 102a, 102b have a cross-point memory architecture. Because the conductive lines CL are electrically coupled to the top electrodes of the first and second memory cell structures 102a, 102b, the leakage paths may result in read and/or write disturbance to the first and second memory cell structures 102a, 102b. Hence, by eliminating voids at the first inter-cell area 106a, the leakage paths may be prevented and the reliability of the first and second memory cell structures 102a, 102b may be increased. Further, manufacturing yields of the integrated chip may be increased.

In some embodiments, the first and second memory cell structures 102a, 102b are RRAM cell structures or some other suitable memory cell structures. In some embodiments, the upper interconnect dielectric layer 110 is or comprises an ELK dielectric material and/or some other suitable dielectric material(s). The ELK dielectric material may, for example, have a dielectric constant less than about 2.5, 2.0, or some other suitable value and/or may, for example, be or comprise porous silicon oxycarbide (SiOC) and/or some other suitable ELK dielectric material(s). In some embodiments, the upper interconnect dielectric layer 110 has a smaller dielectric constant than the inter-cell filler layer 108. For example, the upper interconnect dielectric layer 110 may be or comprise an ELK dielectric material and the inter-cell filler layer 108 may be or comprise TEOS oxide. Other materials are, however, amenable.

The first and second memory cell structures 102a, 102b are in an interconnect structure 112. The interconnect structure 112 comprises the void-free dielectric structure 104, a via dielectric layer 114, and a lower interconnect dielectric layer 116. The via dielectric layer 114 overlies the lower interconnect dielectric layer 116, and the void-free dielectric structure 104 overlies the via dielectric layer 114. Further, the interconnect structure 112 comprises a plurality of wires 118 and a plurality of vias 120 stacked in the various dielectric layers (e.g., the upper and lower interconnect dielectric layers 110, 116) of the interconnect structure 112. The plurality of wires 118 and the plurality of vias 120 define conductive paths electrically coupling the first and second memory cell structures 102a, 102b to other devices and/or components (not shown) of the integrated chip. The plurality of wires 118 comprise the conductive lines CL, and the plurality of vias 120 comprise the top electrode vias TV. Further, the plurality of vias 120 comprise bottom electrode vias BV respectively underlying the first and second memory cell structures 102a, 102b in the via dielectric layer 114.

In some embodiments, the via dielectric layer 114 is or comprise silicon carbide and/or some other suitable dielectric material(s). In some embodiments, the lower interconnect dielectric layer 116 is or comprises an ELK dielectric material and/or some other suitable dielectric material(s). In some embodiments, the lower interconnect dielectric layer 116 is or comprise the same material as the upper interconnect dielectric layer 110. In some embodiments, the wires 118 and/or the vias 120 are or comprise copper, aluminum, aluminum copper, tungsten, some other suitable metal(s), titanium nitride, tantalum nitride, some other suitable conductive material(s), or any combination of the foregoing.

Figure 1B:
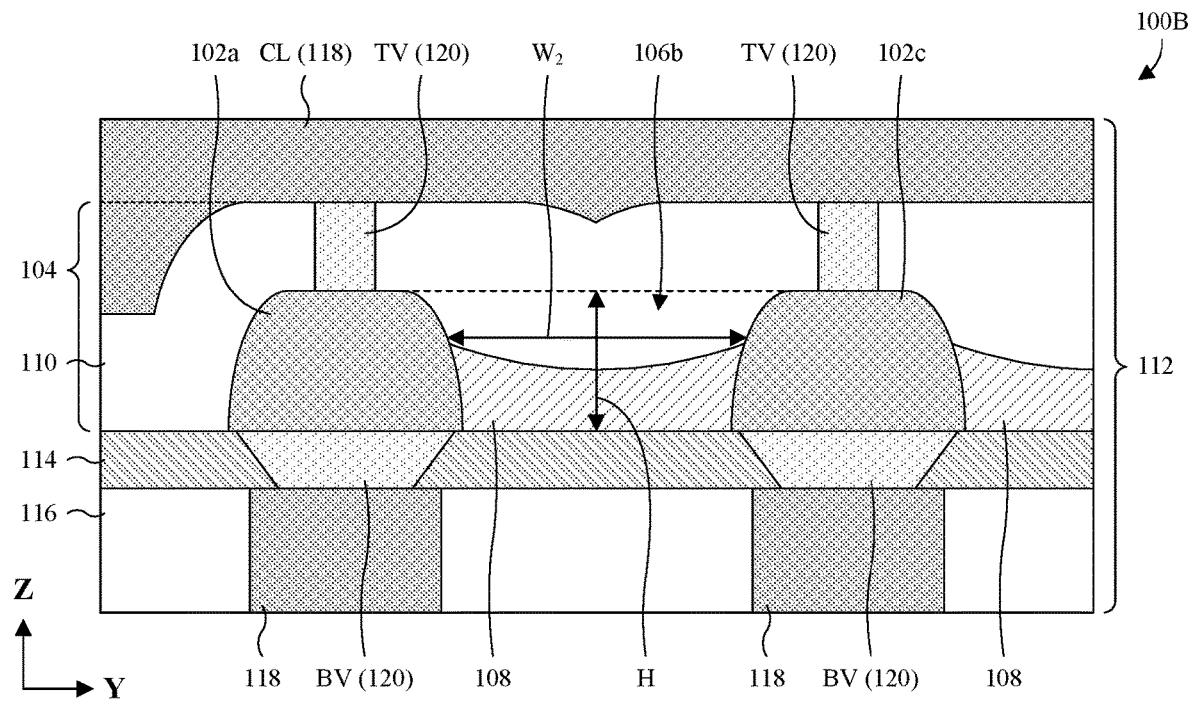

With reference to FIG. 1B, a cross-sectional view 100B of some embodiments of the integrated chip of FIG. 1A is provided along an axis orthogonal to an axis along which the cross-sectional view 100A of FIG. 1A is taken. For example, the cross-sectional view 100A of FIG. 1A may be taken along an axis extending in a X dimension, whereas the cross-sectional view 100B of FIG. 1B may be taken along an axis extending in a Y dimension, or vice versa. The integrated chip comprises the first memory cell structure 102a and further comprises a third memory cell structure 102c. The third memory cell structure 102c may, for example, be as the second memory cell structure 102b of FIG. 1A is illustrated and/or described.

The first and third memory cell structures 102a, 102c are separated from each other by the void-free dielectric structure 104. The void-free dielectric structure 104 is free of voids at a second inter-cell area 106b between the first and third memory cell structures 102a, 102c. The second inter-cell area 106b has an aspect ratio (i.e., a ratio of height H to width $W_2$) that is low compared to that of first inter-cell area 106a (see FIG. 1A). Hence, the upper interconnect dielectric layer 110 would form without, or would have a high likelihood of forming without, a void at the second inter-cell area 106b even if the inter-cell filler layer 108 were omitted.

Because of the lower elevation at the second inter-cell area 106b, the upper interconnect dielectric layer 110 forms with an indent overlying the second inter-cell area 106b. Further, because the conductive line CL overlying and shared by the first and third memory cell structures 102a, 102c is inset into the upper interconnect dielectric layer 110, the conductive line CL has a downward protrusion filling the indent. The indent and the downward protrusion decrease in width from top to bottom and may, for example, have a V-shaped profile and/or some other suitable profile. Further, the downward protrusion has a bottom surface with a small radius of curvature compared to that of a flat surface. The small radius of curvature, in turn, increases electric field strength at the downward protrusion.

If the inter-cell filler layer 108 were omitted, the indent and the downward protrusion would be large and extend to close proximity to bottom electrodes (not shown) of the first and third memory cell structures 102a, 102c. The close proximity and the increased electric field strength would collectively lead to a high risk of dielectric breakdown at the second inter-cell area 106b. The high risk of dielectric breakdown would, in turn, lead to a high risk of leakage paths extending from the conductive line CL, through the second inter-cell area 106b, to the bottom electrodes. Such leakage paths may result in read and/or write disturbance to the first and third memory cell structures 102a, 102c and may hence decrease the reliability of the first and third memory cell structures 102a, 102c.

Because the upper interconnect dielectric layer 110 is formed over the inter-cell filler layer 108, the indent and the downward protrusion are small and distal from the bottom electrodes of the first and third memory cell structures 102a, 102c. Accordingly, the likelihood of dielectric breakdown at the second inter-cell area 106b is low despite the increased electric field strength at the bottom surface of the downward protrusion. Due to the low likelihood of dielectric breakdown, the likelihood of leakage paths extending from the conductive line CL, through the second inter-cell area 106b, to the bottom electrodes is low. Hence, the inter-cell filler layer 108 decreases the likelihood of read and/or write disturbance to the first and third memory cell structures 102a, 102c and further increases the read and/or write reliability of the first and third memory cell structures 102a, 102c.

Figure 2:
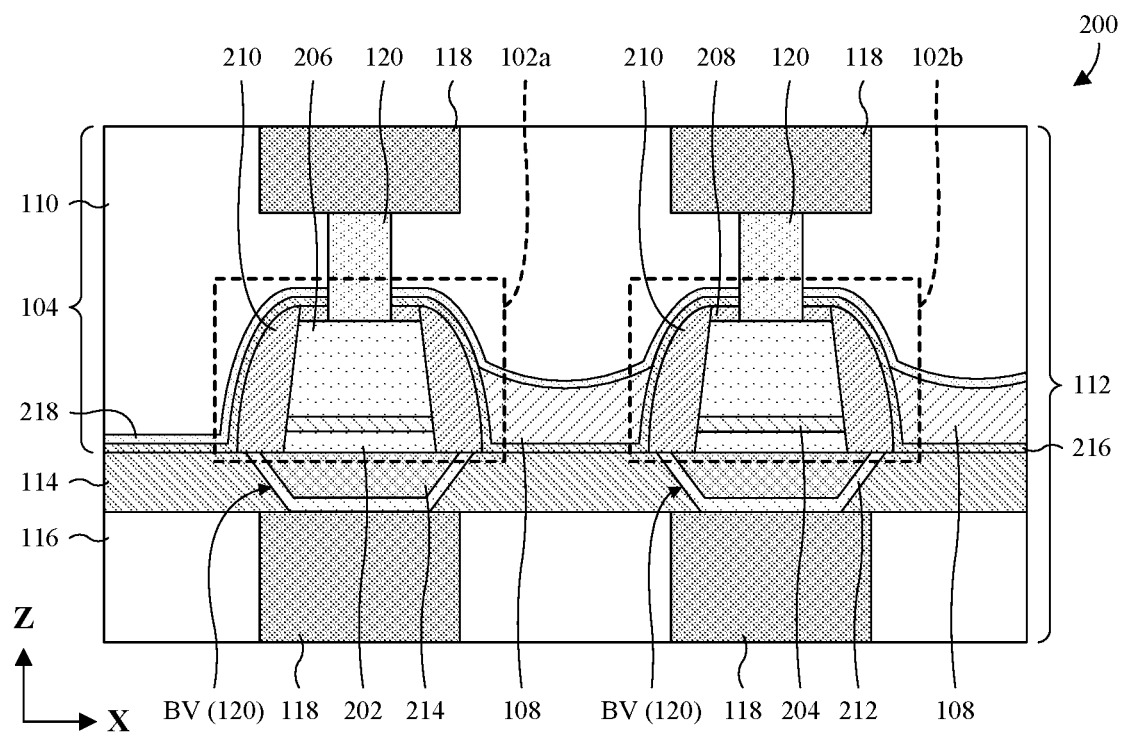
FIG. 2 illustrates a cross-sectional view of some more detailed embodiments of the integrated chip of FIG. 1A.

With reference to FIG. 2, a cross-sectional view 200 of some more detailed embodiments of the integrated chip of FIG. 1A is provided in which the first and second memory cell structures 102a, 102b comprise individual bottom electrodes 202, individual data storage elements 204, individual top electrodes 206, individual hard masks 208, and individual sidewall spacers 210. Note that only one of the bottom electrodes 202, only one of the data storage elements 204, only one of the top electrodes 206, only one of the hard masks 208, and only some segments of the sidewall spacers 210 are labeled.

The data storage elements 204 respectively overlie the bottom electrodes 202, the top electrodes 206 respectively overlie the data storage elements 204, and the hard masks 208 respectively overlie the top electrodes 206. Further, the sidewall spacers 210 are on sidewalls of the top and bottom electrodes 206, 202. The bottom electrodes 202 and/or the top electrodes 206 may, for example, be or comprise a metal and/or some other suitable conductive material(s). The data storage elements 204 may be or comprise, for example, a high k dielectric material (e.g., hafnium oxide or some other suitable high k dielectric material), a ferroelectric material, magnetic tunnel junctions (MTJs), some other suitable data storage material(s) and/or structure(s), or any combination of the foregoing. The sidewall spacers 210 may be or comprise, for example, silicon nitride and/or some other suitable dielectric(s). Further, the sidewall spacers 210 may be or comprise, for example, the same material as the hard masks 208. In some embodiments, the first and second memory cell structures 102a, 102b are RRAM cell structures, ferroelectric random-access memory (FeRAM) cell structures, magnetoresistive random-access memory (MRAM) cell structures, or some other suitable memory cell structures.

The bottom electrode vias BV respectively underlie the first and second memory cell structures 102a, 102b and comprise individual bottom via liners 212 and individual bottom via bodies 214. Note that only one of the bottom via liners 212 and only one of the bottom via bodies 214 are labeled. The bottom via liners 212 respectively cup undersides of the bottom via bodies 214 to prevent material of the bottom via bodies 214 from diffusing to underlying wires and/or to prevent material of the underlying wires from diffusing to the bottom via bodies 214. The bottom via liners 212 may be or comprise, for example, titanium nitride, tantalum nitride, some other suitable liner material(s), or any combination of the foregoing. The bottom via bodies 214 may be or comprise, for example, platinum, iridium, ruthenium, tungsten, silver, copper, nickel, some other suitable conductive material(s), or any combination of the foregoing.

The void-free dielectric structure 104 further comprises an etch stop layer 216 and an upper interconnect dielectric liner 218. The etch stop layer 216 lines the first and second memory cell structures 102a, 102b and separates the inter-cell filler layer 108 from the sidewall spacers 210 and the via dielectric layer 114. The upper interconnect dielectric liner 218 lines the etch stop layer 216 and the inter-cell filler layer 108. Further, the upper interconnect dielectric liner 218 separates the etch stop layer 216 and the inter-cell filler layer 108 from the upper interconnect dielectric layer 110. The etch stop layer 216 may be or comprise, for example, silicon carbide and/or some other suitable dielectric(s). In some embodiments, the etch stop layer 216 is or comprises the same dielectric material as the via dielectric layer 114. The upper interconnect dielectric liner 218 may be or comprise, for example, TEOS oxide and/or other some other suitable dielectric(s). In some embodiments, the upper interconnect dielectric liner 218 and the inter-cell filler layer 108 are or comprise the same material (e.g., TEOS oxide or some other suitable material), except that the inter-cell filler layer 108 is formed by a HDR deposition process and the upper interconnect dielectric liner 218 is formed by a comparatively slow deposition process (i.e., a non-HDR deposition process).

While the bottom electrodes 202 are shown as being separate from the bottom electrode vias BV, the bottom electrodes 202 and the bottom electrode vias BV may be fully or partially integrated in alternative embodiments. For example, the bottom electrodes 202 and the bottom via bodies 214, but not the bottom via liners 212, may be integrated so as to be regions of the same deposition and/or block of material. As another example, the bottom electrodes 202, the bottom via bodies 214, and the bottom via liners 212 may be integrated so as to be regions of the same deposition and/or block of material.

Figure 3A:
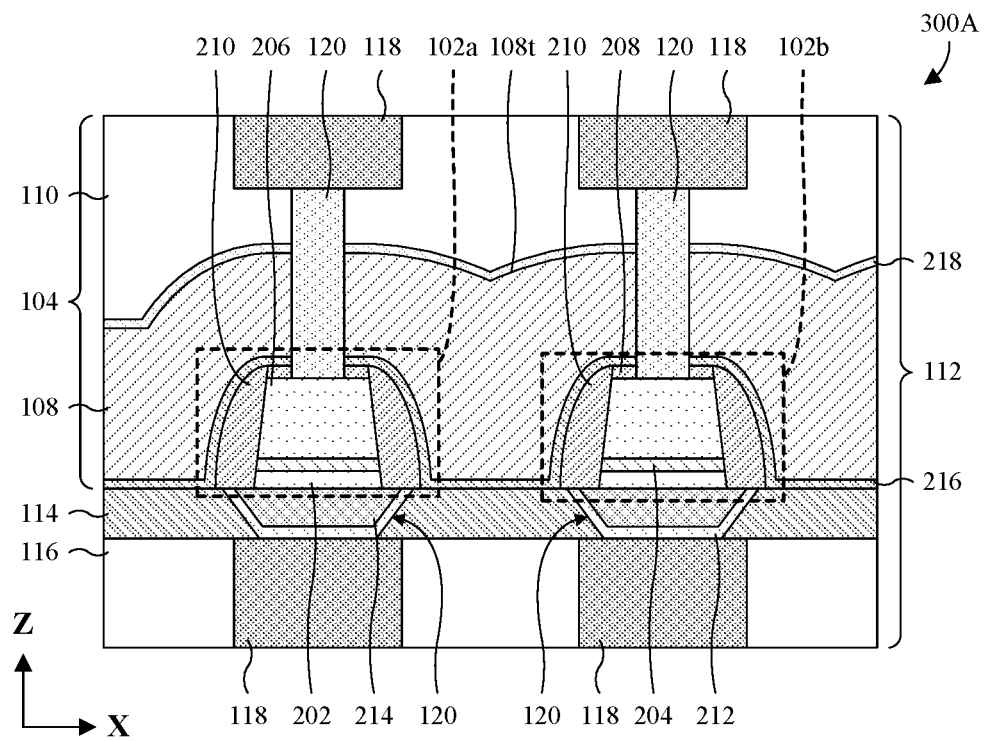
FIGS. 3A-3E illustrate cross-sectional views of some alternative embodiments of the integrated chip of FIG. 2.

With reference to FIG. 3A, a cross-sectional view 300A of some alternative embodiments of the integrated chip of FIG. 2 is provided in which the inter-cell filler layer 108 covers the first and second memory cell structures 102a, 102b and has a top surface 108t conforming to underlying topography.

Figure 3B:
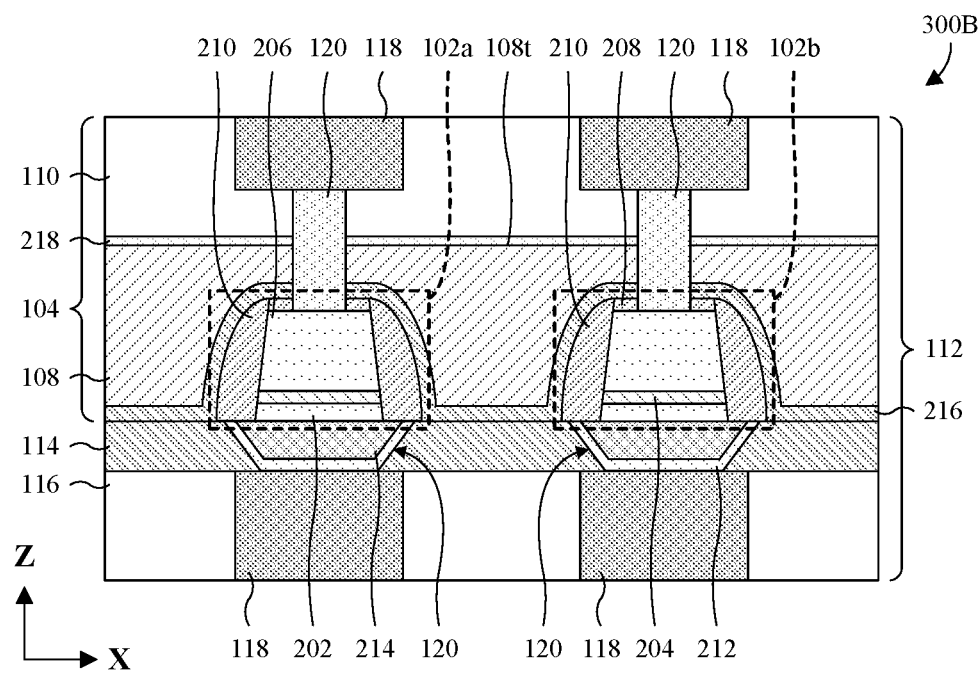

With reference to FIG. 3B, a cross-sectional view 300B of some alternative embodiments of the integrated chip of FIG. 2 is provided in which the inter-cell filler layer 108 covers the first and second memory cell structures 102a, 102b and has a top surface 108t that is planar or substantially planar.

Figure 3C:
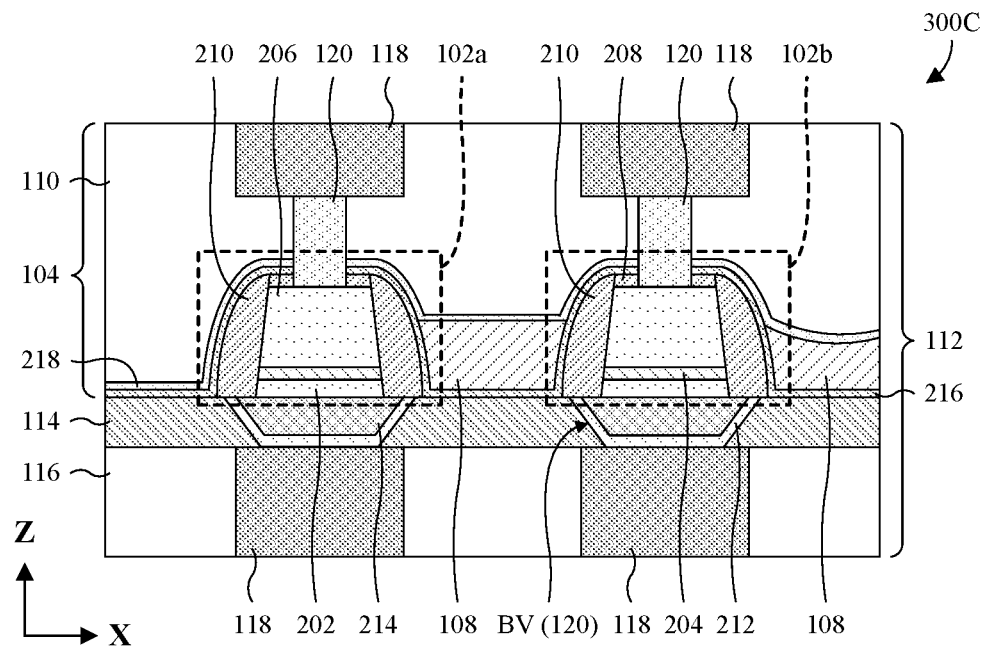

With reference to FIG. 3C, a cross-sectional view 300C of some alternative embodiments of the integrated chip of FIG. 2 is provided in which the inter-cell filler layer 108 has a top surface that is planar or substantially planar.

Figure 3D:
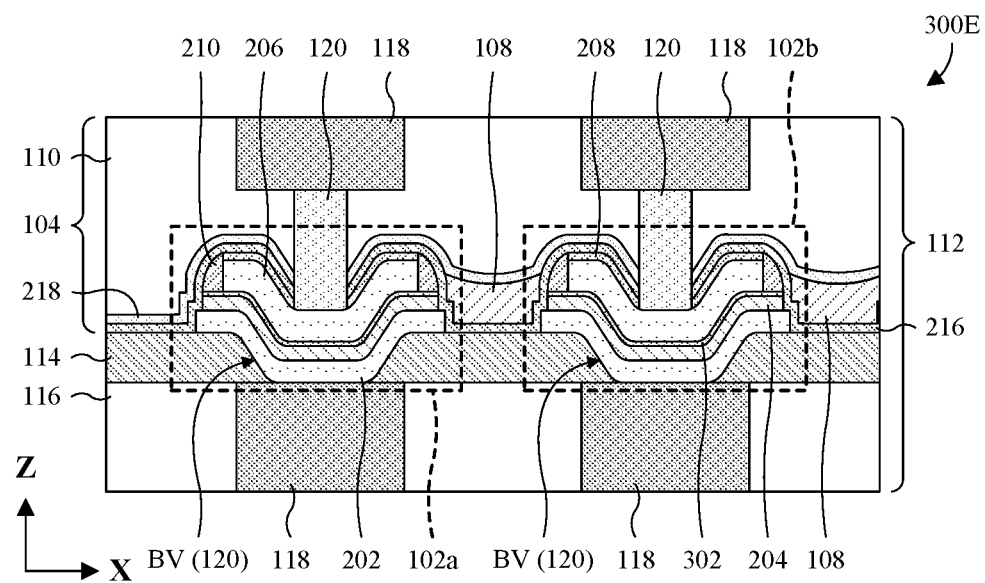

With reference to FIG. 3D, a cross-sectional view 300D of some alternative embodiments of the integrated chip of FIG. 2 is provided in which the bottom electrodes 202 defines the bottom electrode vias BV. The bottom electrodes 202 protrude through the via dielectric layer 114 and are depressed at the bottom electrode vias BV. The data storage elements 204, the top electrodes 206, and the hard masks 208 are stacked over and conform to the bottom electrodes 202. Further, the data storage elements 204, the top electrodes 206, and the hard masks 208 are depressed directly over the bottom electrode vias BV. Note that only one of the bottom electrodes 202 is labeled, only one of the data storage elements 204 is labeled, only one of the top electrodes 206 is labeled, and only one of the hard masks 208 is labeled.

The first and second memory cell structures 102a, 102b further comprise individual cap layers 302 between the data storage elements 204 and the top electrodes 206. The cap layers 302 are or comprise a conductive material having a higher reactivity with oxygen than the top electrodes 206. Such oxygen reactivity may, for example, be quantified in terms of the amount of energy to trigger a reaction between the conductive material and oxygen. The higher the reactivity, the less energy, and vice versa. The cap layers 302 may, for example, increase available oxygen ions and oxygen vacancies for switching when the first and second memory cell structures 102a, 102b are RRAM cell structures. Hence, the cap layers 302 may, for example, increase switching windows of the first and second memory cell structures 102a, 102b. In some embodiments, the top electrodes 206 are or comprise tantalum, aluminum, tungsten, ruthenium, platinum, nickel, copper, gold, some other suitable material(s), or any combination of the foregoing, whereas the cap layers 302 are or comprise hafnium, titanium, zirconium, lanthanum, some other suitable material(s), or any combination of the foregoing.

Figure 3E:
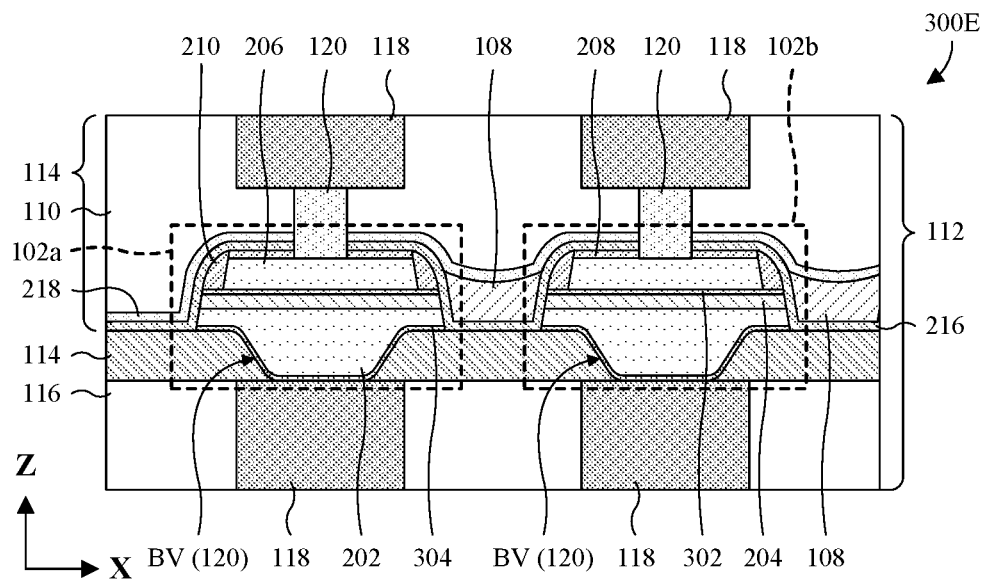

With reference to FIG. 3E, a cross-sectional view 300E of some alternative embodiments of the integrated chip of FIG. 3D is provided in which the bottom electrodes 202 define the bottom electrode vias BV and have top surfaces that are planar or substantially planar. For example, the bottom electrodes 202 may have T-shaped profiles or some other suitable profiles. Also, the first and second memory cell structures 102a, 102b have individual bottom electrode liners 304 respectively cupping undersides of the bottom electrodes 202 to prevent material of the bottom electrodes 202 from diffusing to underlying wires and/or to prevent material of the underlying wires from diffusing to the bottom electrodes 202. The bottom electrode liners 304 may be or comprise, for example, titanium nitride, tantalum nitride, some other suitable liner material(s), or any combination of the foregoing. The bottom electrodes 202 may be or comprise, for example, platinum, iridium, ruthenium, tungsten, silver, copper, nickel, some other suitable conductive material(s), or any combination of the foregoing.

While FIGS. 3D and 3E include the cap layers 302, the cap layers 302 may be omitted in alternative embodiments. Similarly, while FIG. 3E include the bottom electrode liners 304, the bottom electrode liners 304 may be omitted in alternative embodiments. While FIGS. 2 and 3A-3C do not include the cap layers 302 of FIGS. 3D and 3E, the cap layers 302 may be included between the top electrodes 206 and the data storage elements 204 in alternative embodiments. While FIGS. 3C-3E include an inter-cell filler layer 108 recessed below a top surface of the first and second memory cell structures 102a, 102b, the inter-cell filler layer 108 may cover the first and second memory cell structures 102a, 102b as illustrated in FIG. 3A and/or FIG. 3B in alternative embodiments. While FIGS. 2 and 3A-3E are illustrated with the etch stop layer 216 and the upper interconnect dielectric liner 218, the etch stop layer 216 and/or the upper interconnect dielectric liner 218 may be omitted in alternative embodiments.

While FIGS. 2 and 3A-3E are taken along the same axis as FIG. 1A, alternative embodiments of FIGS. 2 and 3A-3E may be taken along the same axis as FIG. 1B. In such alternative embodiments, the second memory cell structure 102b is replaced with a third memory cell structure 102c having the same structure as the first memory cell structure 102a. Further, individual conductive lines CL of the first and second memory cell structures 102a, 102b are replaced with a common conductive line CL common to the first and third memory cell structures 102a, 102c as illustrated in FIG. 1B.

Figure 4B:
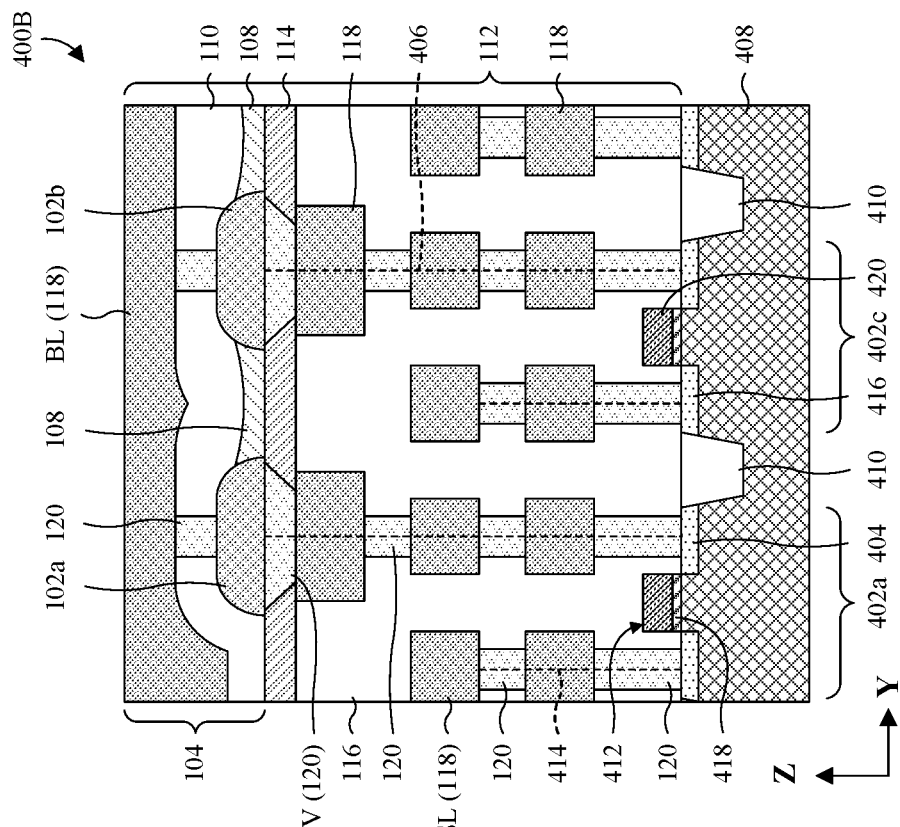
FIGS. 4A and 4B illustrate cross-sectional views of some embodiments of an integrated chip in which one-transistor one-resistor (1T1R) cell structures comprise the memory cell structures of FIGS. 1A and 1B.
Figure 4A:
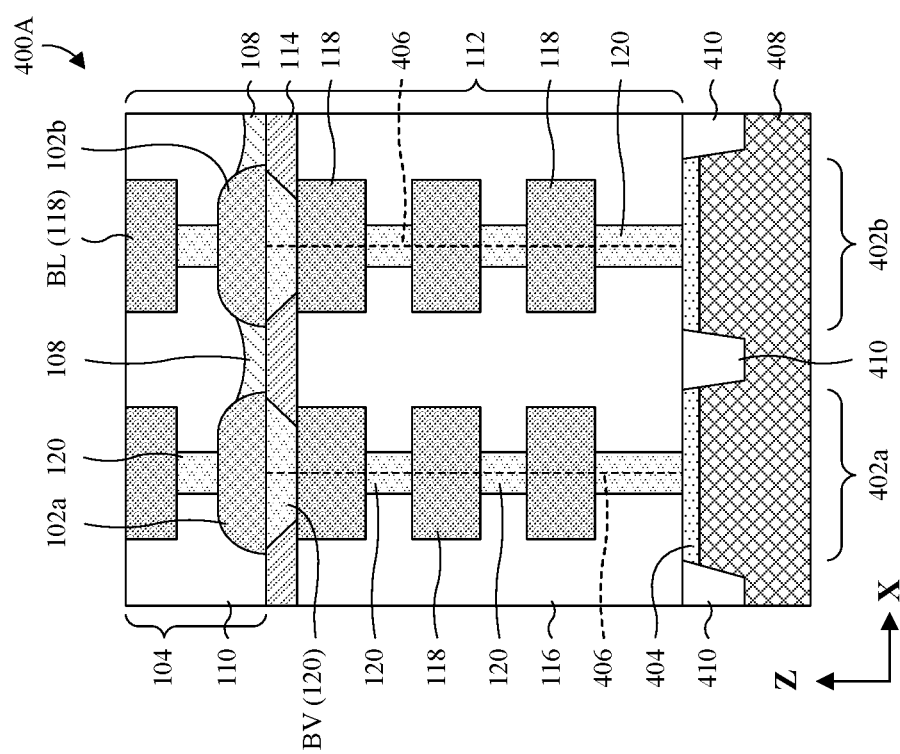

With reference to FIG. 4A, a cross-sectional view 400A of some embodiments of an integrated chip is provided in which a first one-transistor one-resistor (1T1R) cell structure 402a and a second 1T1R cell structure 402b respectively comprise the first and second memory cell structures 102a, 102b of FIG. 1A. The first and second 1T1R cell structures 402a, 402b further comprise individual drain regions 404 and individual drain-side conductive paths 406. Note that only one of the drain regions 404 is labeled.

The drain regions 404 are in a substrate 408 and are electrically separated by a trench isolation structure 410. The drain regions 404 are part of access transistors used to individually select the first and second memory cell structures 102a, 102b when the first and second memory cell structures 102a, 102b are in an array. The substrate 408 may, for example, be a bulk silicon substrate, a silicon-on-insulator (SOI) substrate, or some other suitable semiconductor substrate. The trench isolation structure 410 comprises silicon oxide and/or some other suitable dielectric material(s). The trench isolation structure 410 may, for example, be a shallow trench isolation (STI) structure or some other suitable trench isolation structure.

The drain-side conductive paths 406 electrically couple the drain regions 404 to bottom electrodes (not shown) of the first and second memory cell structures 102a, 102b. Further, the drain-side conductive paths 406 are defined by the interconnect structure 112. The interconnect structure 112 comprises a plurality of wires 118 and a plurality of vias 120, and the wires 118 and the vias 120 are alternatingly stacked. The wires 118 comprise bit lines BL respectively overlying the first and second memory cell structures 102a, 102b and respectively electrically coupled to top electrodes (not shown) of the first and second memory cell structures 102a, 102b by the vias 120. The wires 118 and the vias 120 may be or comprise, for example, copper, aluminum, aluminum copper, titanium, tungsten, titanium nitride, some other suitable conductive material(s), or any combination of the foregoing.

With reference to FIG. 4B, a cross-sectional view 400B of some embodiments of the integrated chip of FIG. 4A is provided along an axis orthogonal to an axis along which the cross-sectional view 400A of FIG. 4A is taken. The first 1T1R cell structure 402a and a third 1T1R cell structure 402c respectively comprise the first and third memory cell structures 102a, 102c of FIG. 1B. The first and third 1T1R cell structures 402a, 402b further comprise individual drain-side conductive paths 406, individual access transistors 412, and individual source-side conductive paths 414. Note that only one of the drain-side conductive paths 406, only one of the access transistors 412, and only one of the source-side conductive paths 414 are labeled.

The access transistors 412 on the substrate 408, between the substrate 408 and the interconnect structure 112. Further, the access transistors 412 are electrically separated from each other by the trench isolation structure 410. The access transistors 412 comprise individual drain regions 404, individual source regions 416, individual gate dielectric layers 418, and individual gate electrodes 420. Note that only one of the drain regions 404, only one of the source regions 416, only one of the gate dielectric layers 418, and only one of the gate electrodes 420 are labeled. The gate electrodes 420 respectively overlie the gate dielectric layers 418 and define word lines in embodiments in which the first and third memory cell structures 102a, 102c are in an array. The drain and source regions 404, 416 are in a substrate 408. The drain regions 404 respectively border drain sides of the gate electrodes 420, and the source regions 416 respectively border source sides of the gate electrodes 420.

The drain-side conductive paths 406 electrically couple the drain regions 404 to the first and third memory cell structures 102a, 102c, and the source-side conductive paths 414 electrically couple the source regions 416 to source lines SL. Note that only one of the source lines SL is labeled. The drain-side and source-side conductive paths 406, 414 are defined by the plurality of wires 118 and the plurality of vias 120.

While FIG. 4A is illustrated using embodiments of the first and second memory cell structures 102a, 102b and the bottom electrode vias BV in FIG. 1A, embodiments in any one or combination of FIGS. 2 and 3A-3E may alternatively be used. While FIG. 4B is illustrated using embodiments of the first and third memory cell structures 102a, 102c and the bottom electrode vias BV in FIG. 1B, embodiments of the first memory cell structure 102a and the bottom electrode vias BV in any one or combination of FIGS. 2 and 3A-3E may alternatively be used for both the first and third memory cell structures 102a, 102c. While FIGS. 4A and 4B are illustrated using embodiments of the void-free dielectric structure 104 in FIGS. 1A and 1B, embodiments in any one of FIGS. 3A and 3B may alternatively be used.

Figure 5:
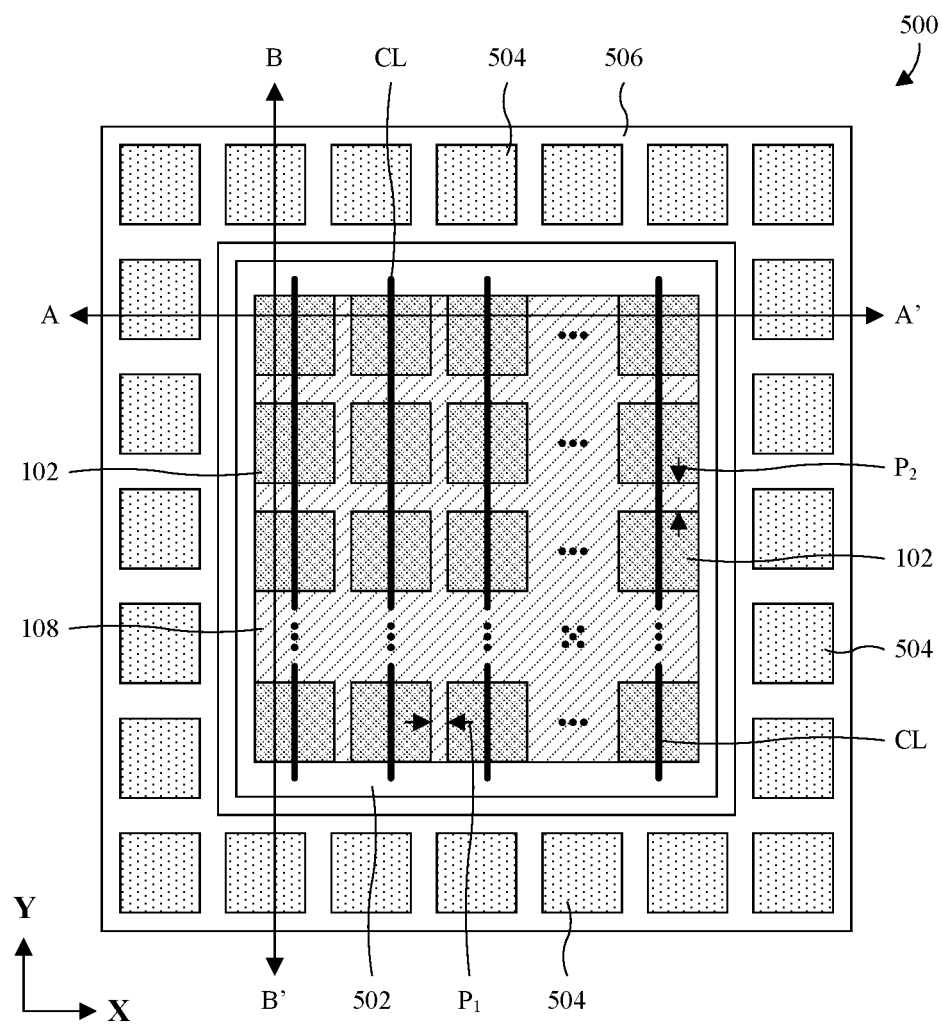
FIG. 5 illustrates a top layout of some embodiments of an integrated chip comprising an array of memory cell structures separated by a void-free dielectric structure.

With reference to FIG. 5, a top layout 500 of some embodiments of an integrated chip comprising an array of memory cell structures 102 at least partially separated by an inter-cell filler layer 108 is provided. Note that only some of the memory cell structures 102 are labeled. As discussed above, the inter-cell filler layer 108 reduces the risk of dielectric breakdown in an interconnect dielectric layer (not shown) that covers the memory cell structures 102 (when viewed in cross section). Such dielectric breakdown is exacerbated by use of ELK dielectric materials (due to the low dielectric constants) and potentially leads to leakage paths between top and bottom electrodes of the memory cell structures 102. In some embodiments, the inter-cell filler layer 108 has a grid-shaped layout or some other suitable layout.

The memory cell structures 102 are at a memory region 502 of the integrated chip and are in a plurality of rows and plurality of columns. The memory cell structures 102 have a first pitch $P_1$ along the rows, and further have a second pitch $P_2$ greater than the first pitch $P_1$ along the columns. The first pitch $P_1$ may, for example, be the same as the first width $W_1$ in FIG. 1A, whereas the second pitch $P_2$ may, for example, be the same as the second width $W_2$ in FIG. 1B. The memory cell structures 102 may, for example, be as illustrated and/or described in any one or combination of FIGS. 1A, 1B, 2, 3A-3E, 4A, and 4B. FIGS. 1A, 2, 3A-3E, and 4A may, for example, be taken along line A-A' and/or FIGS. 1B and 4B may, for example, be taken along line B-B'. In some embodiments, the memory cell structures 102 partially define individual 1T1R cell structures as illustrated and described with regard FIGS. 4A and 4B. In other embodiments, the memory cell structures 102 partially define individual one-selector one-resistor (1S1R) cell structures or other suitable cell structure(s).

Conductive lines CL extend respectively along the columns and electrically couple with memory cell structures 102 in the respective columns. The conductive lines CL may also be referred to as bit lines or word lines depending upon a memory architecture of the memory cell structures 102. Peripheral devices 504 surround the memory cell structures 102 at a peripheral region 506 of the integrated chip. Note that only some of the conductive lines CL and some of peripheral devices 504 are labeled. The peripheral devices 504 may, for example, be or comprise transistors and/or other suitable semiconductor device(s). Further, the peripheral devices 504 may, for example, implement read/write circuitry and/or other suitable circuitry for operation of the memory cell structures 102.

With reference to FIGS. 6A and 6B, cross-sectional views 600A, 600B of some embodiments of the integrated chip of FIG. 5 are provided. The cross-sectional view 600A of FIG. 6A may, for example, be taken along line A-A' in FIG. 5, whereas the cross-sectional view 600B of FIG. 6B may, for example, be taken along line B-B' in FIG. 5. The memory cell structures 102 are as the first and second memory cell structures 102a, 102b of FIG. 2 are illustrated and the bottom electrode vias BV are as illustrated in FIG. 2. Further, the memory cell structures 102 are separated by the void-free dielectric structure 104, which comprises the inter-cell filler layer 108, the upper interconnect dielectric layer 110, the etch stop layer 216, and the upper interconnect dielectric liner 218. Note that only one of the memory cell structures 102 is labeled in each of FIGS. 6A and 6B and only one of the bottom electrode vias BV is labeled in each of FIGS. 6A and 6B. Further, note that the constituent components of the memory cell structures 102 are only labeled once in each of FIGS. 6A and 6B.

While FIGS. 6A and 6B are illustrated using embodiments of the first and second memory cell structures 102a, 102b and the bottom electrode vias BV in FIG. 2, embodiments in FIGS. 3D and 3E may be used in alternative embodiments. Further, while FIGS. 6A and 6B are illustrated using embodiments of the void-free dielectric structure 104 in FIG. 2, embodiments in FIGS. 3A and 3B may be used in alternative embodiments.

With reference to FIGS. 7-17, a series of cross-sectional views 700-1700 of some embodiments of a method for forming an integrated chip comprising memory cell structures separated by a void-free dielectric structure is provided. The cross-sectional views 700-1700 are taken along an axis extending in an X dimension and may therefore, for example, be taken along line A-A' in FIG. 5. In alternative embodiments, the cross-sectional views 700-1700 may be taken along an axis extending in a Y dimension and/or may be taken along line B-B' in FIG. 5. The method may, for example, be performed to form the integrated chip in any one or combination of FIGS. 1A, 1B, 2, 3A-3E, 4A, 4B, 5, 6A, and 6B.

Figure 7:
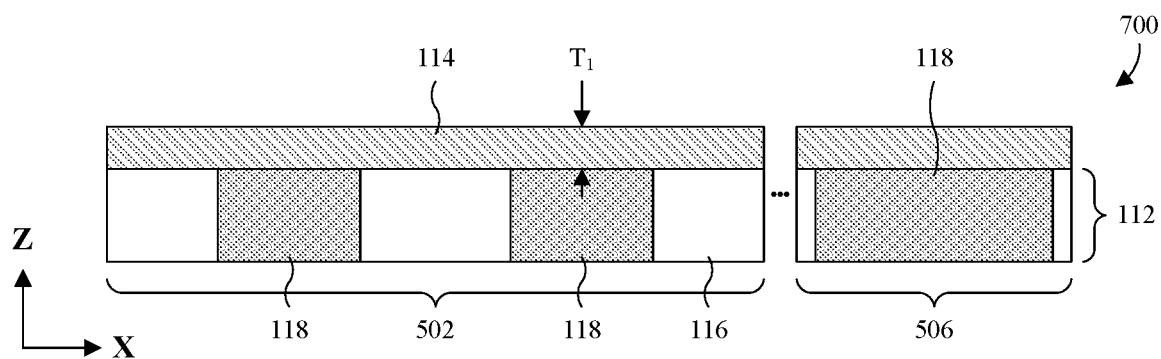
FIGS. 7-17 illustrates a series of cross-sectional views of some embodiments of a method for forming an integrated chip comprising memory cell structures separated by a void-free dielectric structure.

As illustrated by the cross-sectional view 700 of FIG. 7, an interconnect structure 112 is partially formed over a substrate (not shown). The interconnect structure 112 is formed at a memory region 502 of the integrated chip being formed and is further formed at a peripheral region 506 of the integrated chip being formed. A top layout of the memory region 502 and/or a top layout of the peripheral region 506 may, for example, be as illustrated in FIG. 5. The interconnect structure 112 comprises a lower interconnect dielectric layer 116, and further comprises a plurality of wires 118 and a plurality of vias (not shown). The wires 118 and the vias are alternatingly stacked in the lower interconnect dielectric layer 116 to define conductive paths to and/or from semiconductor devices (not shown) on the substrate. Examples of the substrate, the vias, and the semiconductor devices are illustrated in FIGS. 4A and 4B.

Also illustrated by the cross-sectional view 700 of FIG. 7, a via dielectric layer 114 is formed on the interconnect structure 112. A thickness $T_1$ of the via dielectric layer 114 may, for example, be about 300 angstroms, about 250-350 angstroms, or some other suitable value or range of values.

Figure 8:
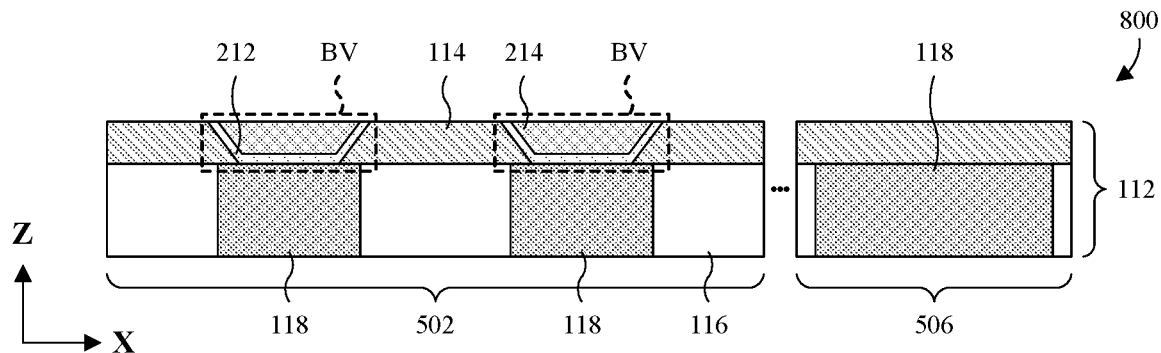

As illustrated by the cross-sectional view 800 of FIG. 8, a pair of bottom electrode vias BV is formed in the via dielectric layer 114. The bottom electrode vias BV extend through the via dielectric layer 114 to underlying wires and expand the interconnect structure 112. The bottom electrode vias BV comprise individual bottom via liners 212 and individual bottom via bodies 214. Note that only one of the bottom via liners 212 and only one of the bottom via bodies 214 are labeled. The bottom via liners 212 cup undersides of the bottom via liners 212 to prevent diffusion. For example, the bottom via liners 212 may prevent material from underlying wires from diffusing to the bottom via bodies 214 and/or may prevent material of bottom via bodies 214 from diffusing to the underlying wires.

In some embodiments, a process for forming the bottom electrode vias BV comprises: 1) patterning the via dielectric layer 114 to form via openings; 2) depositing a conductive liner layer covering the via dielectric layer 114 and lining the via openings; 3) depositing a conductive body layer covering the conductive liner layer and filling the via openings; and 4) performing a planarization into the conductive liner and body layers until a top surface of the via dielectric layer 114 is reached. Other processes for forming the bottom electrode vias BV are, however, amenable in alternative embodiments.

Figure 9:
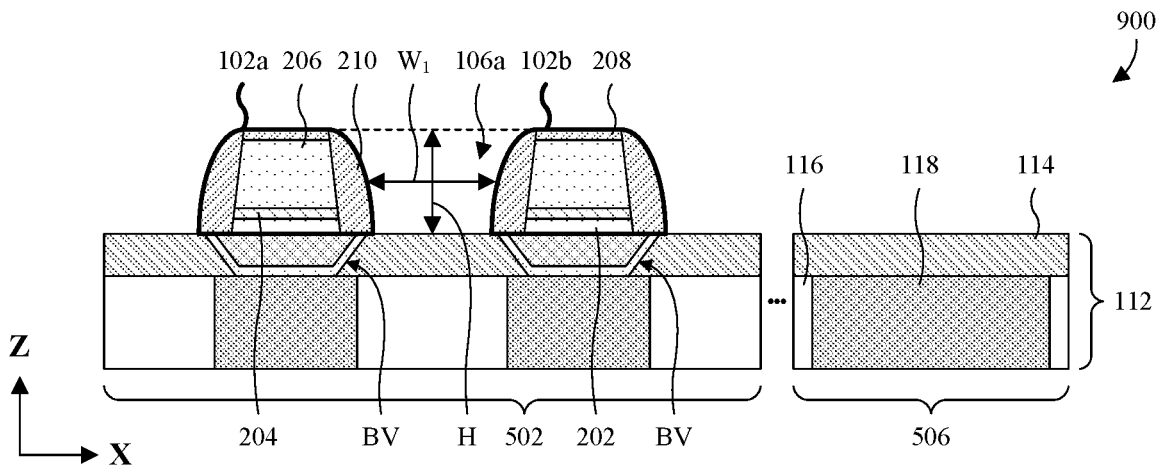

As illustrated by the cross-sectional view 900 of FIG. 9, a first memory cell structure 102a and a second memory cell structure 102b are respectively formed on the bottom electrode vias BV. The first and second memory cell structures 102a, 102b are separated by an inter-cell area 106a having a high aspect ratio (i.e., a high ratio of height H to width $W_1$). The HAR may, for example, be greater than about 1:1, 2:1, 5:1, 10:1, or some other suitable ratio(s). The first and second memory cell structures 102a, 102b comprise individual bottom electrodes 202, individual data storage elements 204, individual top electrodes 206, individual hard masks 208, and individual sidewall spacers 210. Note that only one of the bottom electrodes 202, only one of the data storage elements 204, only one of the top electrodes 206, only one of the hard masks 208, and only one of the sidewall spacers 210 are labeled. The bottom electrodes 202, the data storage elements 204, the top electrodes 206, and the hard masks 208 are stacked upon each other and the sidewall spacers 210 line sidewalls of the stack.

In some embodiment, a process for forming the first and second memory cell structures 102a, 102b comprises: 1) depositing a bottom electrode layer over the via dielectric layer 114 and the bottom electrode vias BV; 2) depositing a data storage layer over the bottom electrode layer; 3) depositing a top electrode layer over the data storage layer; 4) depositing a hard mask layer over the top electrode layer; 5) patterning the bottom electrode layer, the data storage layer, the top electrode layer, and the hard mask layer respectively into the bottom electrodes 202, the data storage elements 204, the top electrodes 206, and the hard masks 208; 6) depositing a sidewall spacer layer; and 7) etching back the sidewall spacer layer to form the sidewall spacers 210. Other processes for forming the first and second memory cell structures 102a, 102b are, however, amenable in alternative embodiments.

While FIGS. 8 and 9 illustrate formation of the first and second memory cell structures 102a, 102b and the bottom electrode vias BV according to embodiments in FIG. 2, embodiments of the first and second memory cell structures 102a, 102b in FIG. 3D and/or FIG. 3E may alternatively be formed.

Figure 10:
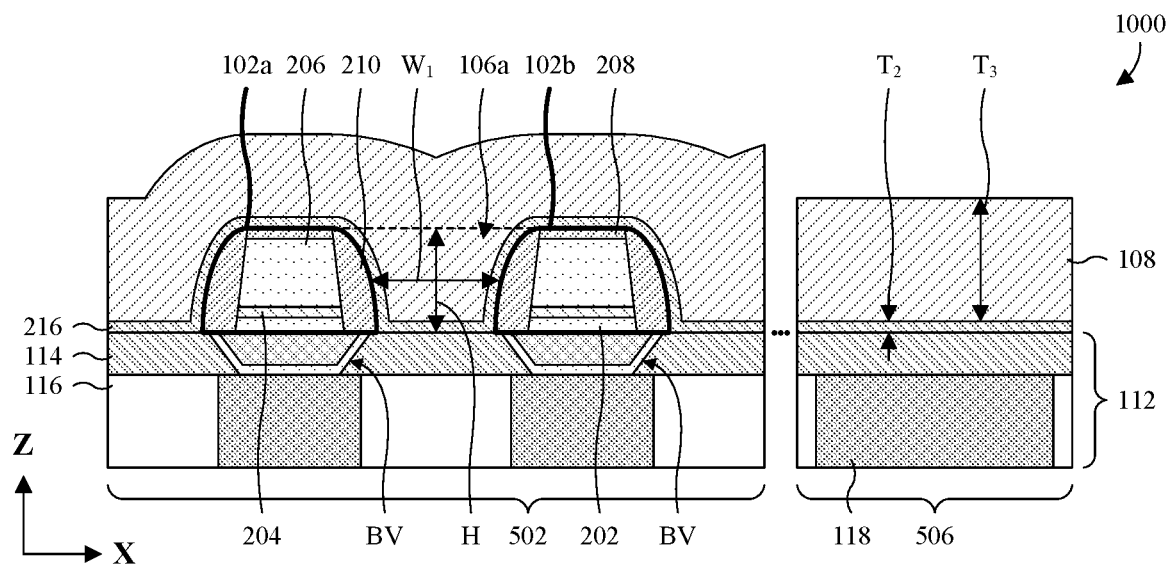

As illustrated by the cross-sectional view 1000 of FIG. 10, an etch stop layer 216 is formed over the first and second memory cell structures 102a, 102b. The etch stop layer 216 lines the first and second memory cell structures 102a, 102b, and further lines the inter-cell area 106a without completely filling the inter-cell area 106a. In some embodiments, a thickness $T_2$ of the etch stop layer 216 is about 150 angstroms, about 100-200 angstroms, or some other suitable value or range of values. The etch stop layer 216 may, for example, be or comprise silicon carbide, the same material as the via dielectric layer 114, some other suitable dielectric material(s), or any combination of the foregoing. The etch stop layer 216 may, for example, be formed by vapor deposition and/or some other suitable deposition process(es).

Also illustrated by the cross-sectional view 1000 of FIG. 10, an inter-cell filler layer 108 is formed covering the etch stop layer 216 and filling the inter-cell area 106a over the etch stop layer 216. In some embodiments, a thickness $T_3$ of the inter-cell filler layer 108 is about 1500 angstroms, about 600-2000 angstroms, greater than about 2000 angstroms, or some other suitable value or range of values. The inter-cell filler layer 108 may, for example, be or comprise TEOS oxide and/or some other suitable dielectric material(s).

The inter-cell filler layer 108 is formed by a HAR deposition process so the inter-cell filler layer 108 forms without a void at the inter-cell area 106a. A HAR deposition process is less likely to form voids in HAR areas than a non-HAR deposition process. The non-HAR deposition process may, for example, be or comprise a low-pressure chemical vapor deposition (LPCVD) process or some other suitable non-HAR deposition process. The HAR deposition process may, for example, be or comprise a sub atmospheric chemical vapor deposition (SA-CVD) process using TEOS and ozone precursors, a high-density plasma chemical vapor deposition (HDP-CVD) process, an HDR chemical vapor deposition (HDR-CVD) process using a TEOS precursor, some other suitable HAR and/or HDR deposition process, or any combination of the foregoing. An HDR deposition process may, for example, be a process with a deposition rate that is at least about 3, 5, or 10 times greater than a non-HDR deposition process. The non-HDR deposition process may, for example, be or comprise a LPCVD process or some other suitable non-HDR process. The HDR deposition process may, for example, be or comprise a SA-CVD process using a TEOS precursor or some other suitable HDR deposition process. In some embodiments, the HAR and/or HDR deposition process is/are conformal.

Figure 11:
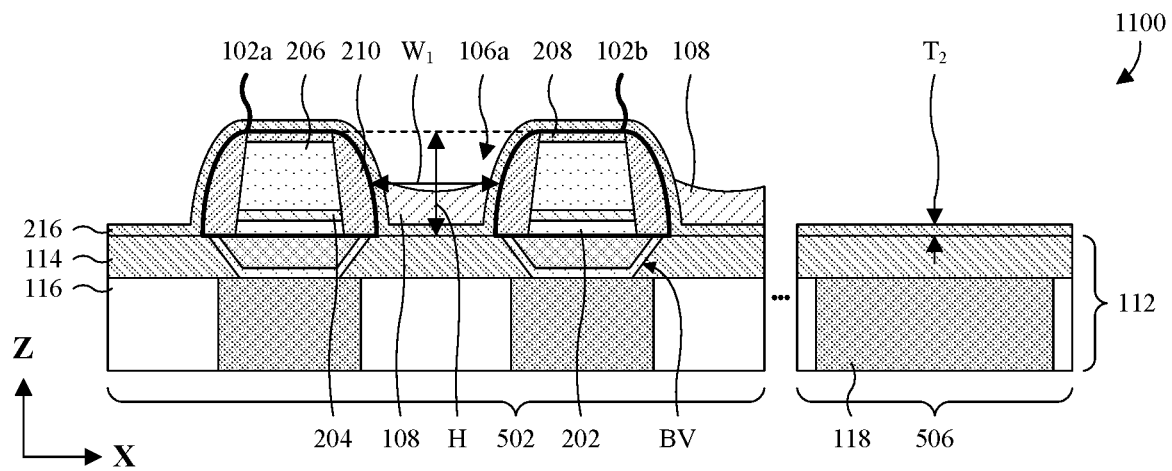

As illustrated by the cross-sectional view 1100 of FIG. 11, the inter-cell filler layer 108 is etched back until a top surface of the inter-cell filler layer 108 is below top surfaces of the first and second memory cell structures 102a, 102b. During the etch back, the etch stop layer 216 serves as an etch stop to prevent damage to the first and second memory cell structures 102a, 102b and the thickness $T_2$ of the etch stop layer 216 is reduced. The etch back clears the inter-cell filler layer 108 from the peripheral region 506, and further clears the inter-cell filler layer 108 from atop the first and second memory cell structures 102a, 102b. However, the etch back does not clear the inter-cell filler layer 108 from the inter-cell area 106a.

Due to differences in topography, the inter-cell filler layer 108 forms with a greater thickness at the inter-cell area 106a than at the peripheral region 506 and atop the first and second memory cell structures 102a, 102b. See, for example, FIG. 10. Accordingly, the etch back would have to persist longer to clear the inter-cell filler layer 108 from the inter-cell area 106a than from the peripheral region 506 and atop the first and second memory cell structures 102a, 102b. However, the etch back stops after clearing inter-cell filler layer 108 from the peripheral region 506 and atop the first and second memory cell structures, but before clearing the inter-cell filler layer 108 from the inter-cell area 106a.

Figure 12:
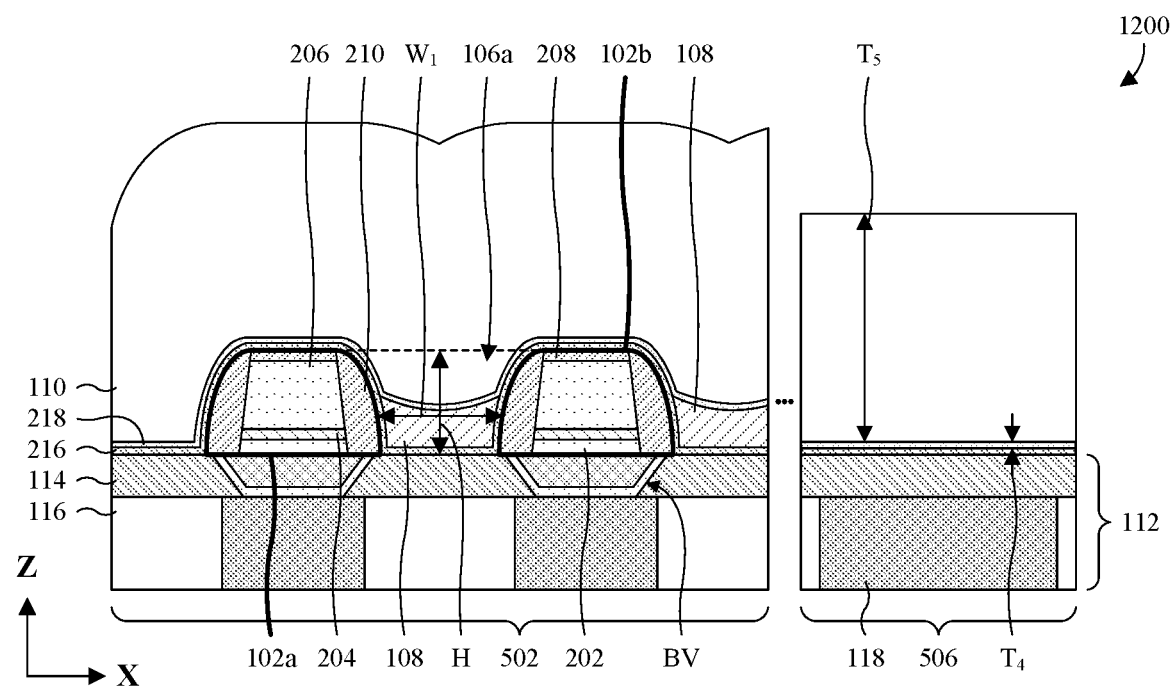

As illustrated by the cross-sectional view 1200 of FIG. 12, an upper interconnect dielectric liner 218 is formed over the etch stop layer 216 and the inter-cell filler layer 108. The upper interconnect dielectric liner 218 lines the etch stop layer 216, and further lines a remainder of the inter-cell area 106a without completely filling the remainder of the inter-cell area 106a. In some embodiments, a thickness $T_4$ of the upper interconnect dielectric liner 218 is about 150 angstroms, about 100-200 angstroms, or some other suitable value or range of values. The upper interconnect dielectric liner 218 may, for example, be or comprise TEOS oxide, the same material as the inter-cell filler layer 108, some other suitable dielectric(s), or any combination of the foregoing. The upper interconnect dielectric liner 218 may, for example, be formed by vapor deposition and/or some other suitable deposition process(es). In some embodiments, the upper interconnect dielectric liner 218 and the inter-cell filler layer 108 are or comprise TEOS oxide and the upper interconnect dielectric liner 218 is deposited at a slower rate than the inter-cell filler layer 108. For example, the upper interconnect dielectric liner 218 may be formed by a LPCVD process using a TEOS precursor or some other suitable non-HDR deposition process, whereas the inter-cell filler layer 108 may be formed by a SA-CVD process using a TEOS precursor or some other suitable HDR deposition process.

As illustrated by the cross-sectional view 1200 of FIG. 12, an upper interconnect dielectric layer 110 is formed covering the upper interconnect dielectric liner 218 and filling a remainder of the inter-cell area 106a. The upper interconnect dielectric layer 110 may, for example, be or comprises an ELK dielectric material and/or some other suitable dielectric material(s). The ELK dielectric material may, for example, have a dielectric constant less than about 2.5, 2.0, or some other suitable value and/or may, for example, be or comprise porous SiOC and/or some other suitable ELK dielectric material(s). In some embodiments, a thickness $T_5$ of the upper interconnect dielectric layer 110 is about 2650 angstroms, about 2560 angstroms, about 2000-3000 angstroms, or some other suitable value or range of values. The upper interconnect dielectric layer 110 may, for example, be formed by vapor deposition and/or some other suitable deposition process(es). In some embodiments, the upper interconnect dielectric layer 110 is formed by LPCVD or some other suitable non-HAR and/or non-HDR deposition process. In some embodiments, the upper interconnect dielectric layer 110 is deposited at a slower rate than the inter-cell filler layer 108. For example, the upper interconnect dielectric layer 110 may be formed by a LPCVD process and the inter-cell filler layer 108 may be formed by a SA-CVD process using a TEOS precursor or some other suitable HDR deposition process.

Because the inter-cell area 106a has a HAR, the upper interconnect dielectric layer 110 would form with a void at the inter-cell area 106a if the inter-cell filler layer 108 were omitted. However, because the inter-cell filler layer 108 partially fills the inter-cell area 106a, a remainder of the inter-cell area 106a has a comparatively low aspect ratio. Accordingly, the upper interconnect dielectric layer 110 forms without a void at the inter-cell area 106a. A void at the inter-cell area 106a would be electrically insulating but would have a lower dielectric constant than the upper interconnect dielectric layer 110 and would hence be more prone to dielectric breakdown that leads to leakage current. Hence, by forming the upper interconnect dielectric layer 110 without a void at the inter-cell area 106a, leakage current is reduced at the inter-cell area 106a and other like areas in a memory array.

Figure 13:
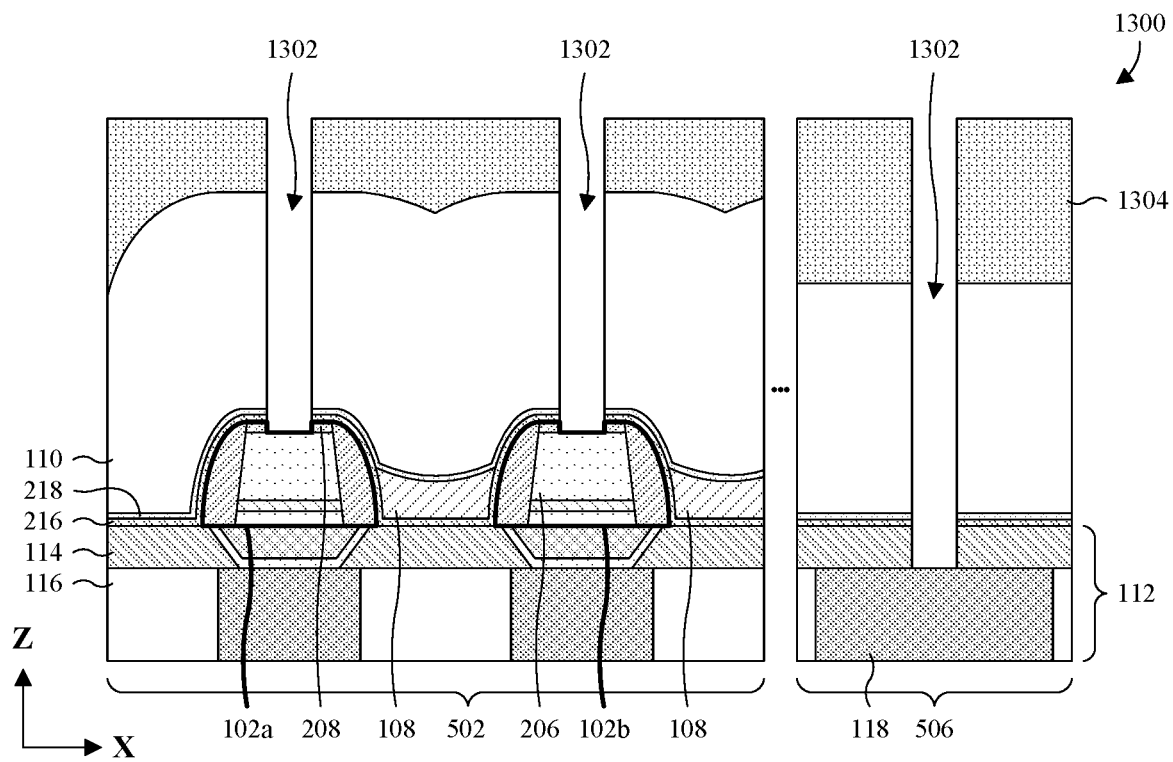

As illustrated by the cross-sectional view 1300 of FIG. 13, the upper interconnect dielectric layer 110, the upper interconnect dielectric liner 218, the etch stop layer 216, the hard masks 208, and the via dielectric layer 114 are patterned to form via openings 1302. The via openings 1302 expose the top electrodes 206 and further expose at least one of the wires 118 at the peripheral region 506. The patterning may, for example, be performed by a photolithography/etching process or some other suitable patterning process. In some embodiments, the photolithography/etching process comprises: 1) forming a first mask 1304 on the upper interconnect dielectric layer 110 and with a layout of the via openings 1302; 2) performing an etch into the aforementioned layers (e.g., the upper interconnect dielectric layer 110) with the first mask 1304 in place; and 3) fully or partially removing the first mask 1304. The first mask 1304 may be or comprise, for example, photoresist and/or a hard mask material.

Figure 14:
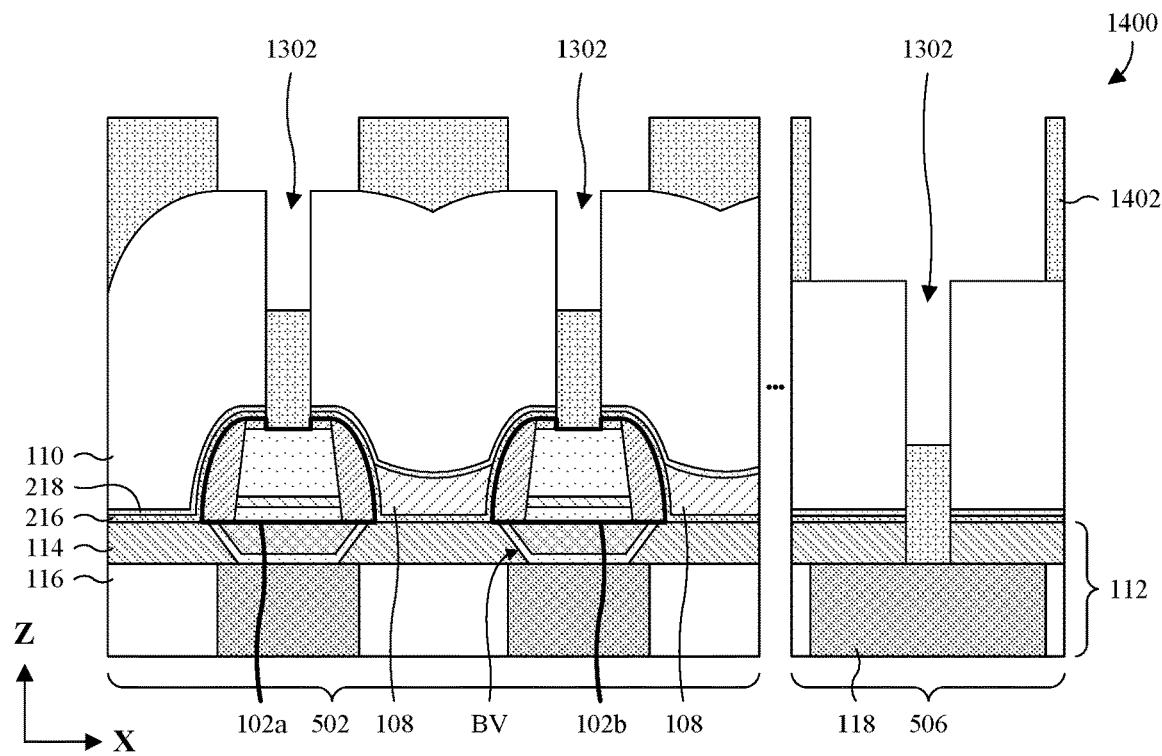
Figure 15:
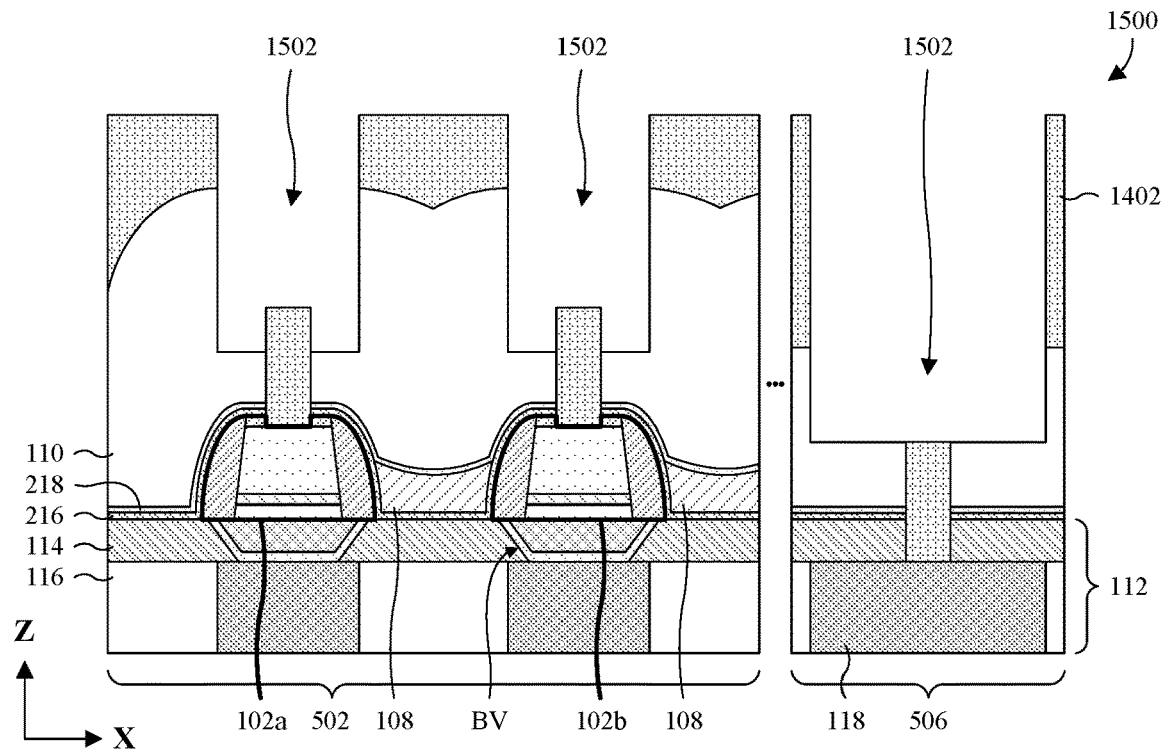

As illustrated by the cross-sectional views 1400, 1500 of FIGS. 14 and 15, the upper interconnect dielectric layer 110 is patterned to form wire openings 1502 (see FIG. 15) overlapping with the via openings 1302 (see FIG. 14). The patterning may, for example, be performed by a photolithography/etching process or some other suitable patterning process. In some embodiments, the photolithography/etching process comprises: 1) forming a second mask 1402 on the upper interconnect dielectric layer 110 and with a layout of the wire openings 1502; 2) performing an etch into the upper interconnect dielectric layer 110 with the second mask 1402 in place; and 3) fully or partially removing the second mask 1402. The second mask 1402 may be or comprise, for example, photoresist and/or a hard mask material.

Figure 16:
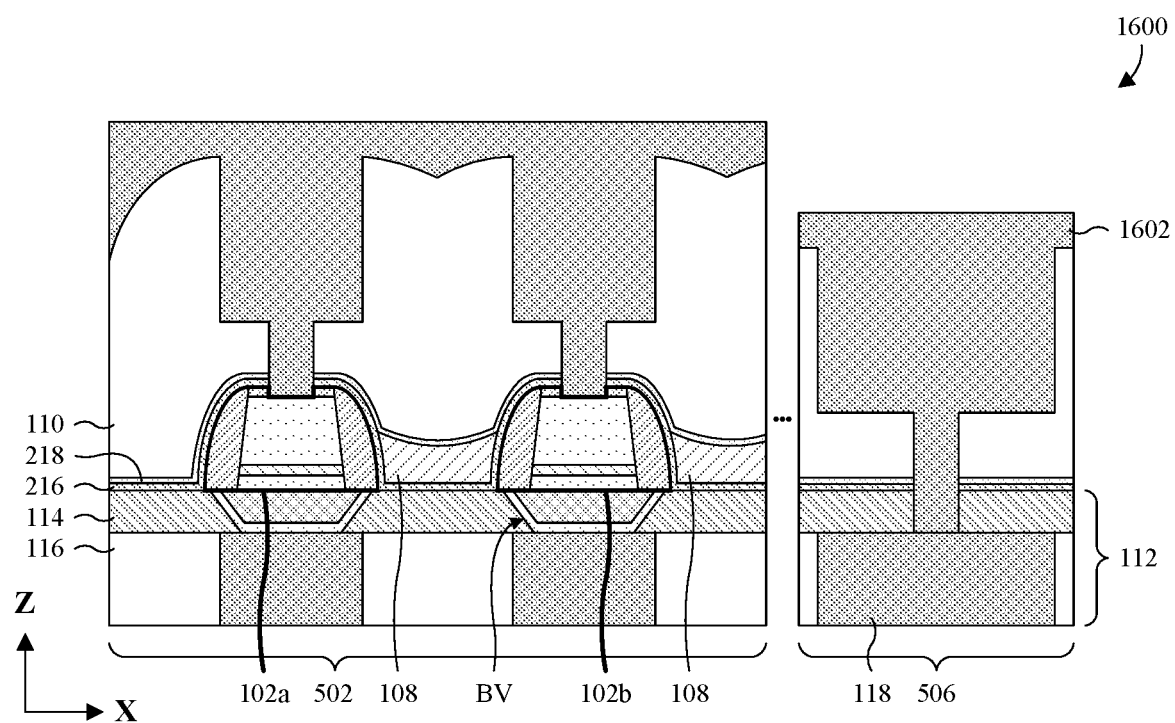

As illustrated the cross-sectional view 1600 of FIG. 16, a conductive layer 1602 is formed filling the via openings 1302 (see FIG. 14) and the wire openings 1502 (see FIG. 15). The conductive layer 1602 may, for example, be formed by vapor deposition, electroplating, electroless plating, some other suitable deposition process, or any combination of the foregoing.

Figure 17:
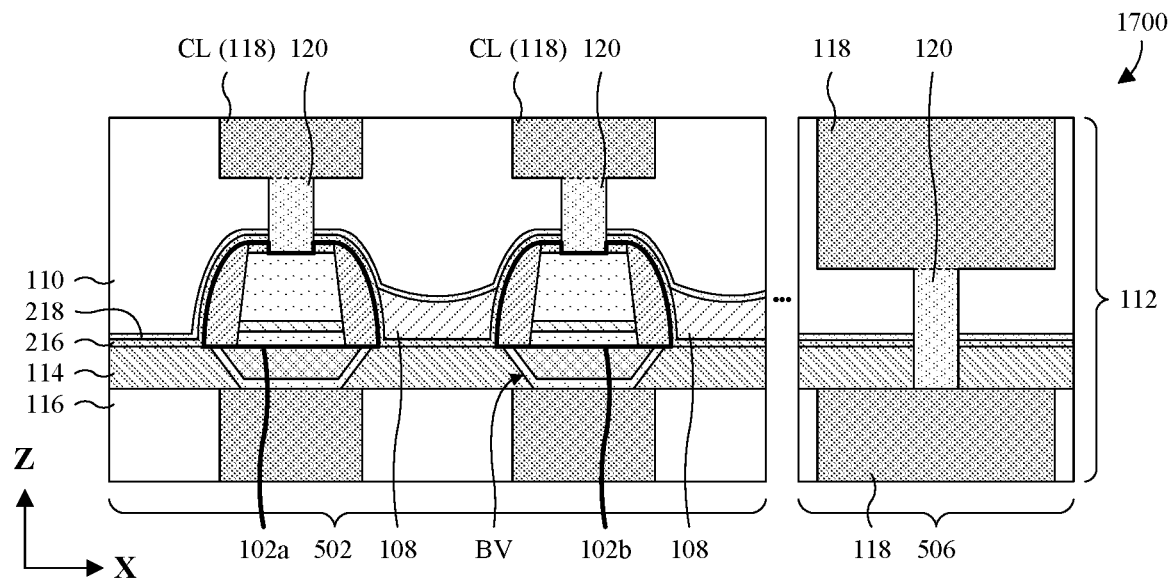

As illustrated by the cross-sectional view 1700 of FIG. 17, a planarization is performed into the conductive layer 1602 (see FIG. 16) to form additional wires 118 and additional vias 120. For clarity, the hashing has been changed between the additional wires 118 and the additional vias 120, notwithstanding that the additional wires 118 and the additional vias 120 are continuous with each other. The additional wires 118 comprise conductive lines CL respectively overlying and electrically coupled to the first and second memory cell structures 102a, 102b by the additional vias 120. The planarization may, for example, be performed by a chemical mechanical polish (CMP) and/or some other suitable planarization.

While FIGS. 7-17 are described with reference to a method, it will be appreciated that the structures shown in FIGS. 7-17 are not limited to the method but rather may stand alone separate of the method. Further, while FIGS. 7-17 are described as a series of acts, it will be appreciated that the order of the acts can be altered in other embodiments. In other embodiments, some acts that are illustrated and/or described may be omitted in whole or in part. For example, the etch back at FIG. 11 may be omitted to form embodiments of the integrated chip at FIG. 3A. In other embodiments, additional acts that are not illustrated and/or described may be performed. For example, the etch back at FIG. 11 may be omitted and a planarization may be performed between the acts of FIGS. 10 and 12 to form the integrated chip at FIG. 3B. As another example, the etch back at FIG. 11 may be performed and a planarization may be performed between the acts of FIGS. 10 and 11 to form the integrated chip at FIG. 3C. The planarization in both examples may, for example, flatten a top surface of upper interconnect dielectric layer 110 and/or may, for example, be performed by a CMP or some other suitable planarization process. In some embodiments, the methods disclosed by FIGS. 7-17 are applied to form other structures.

Figure 18:
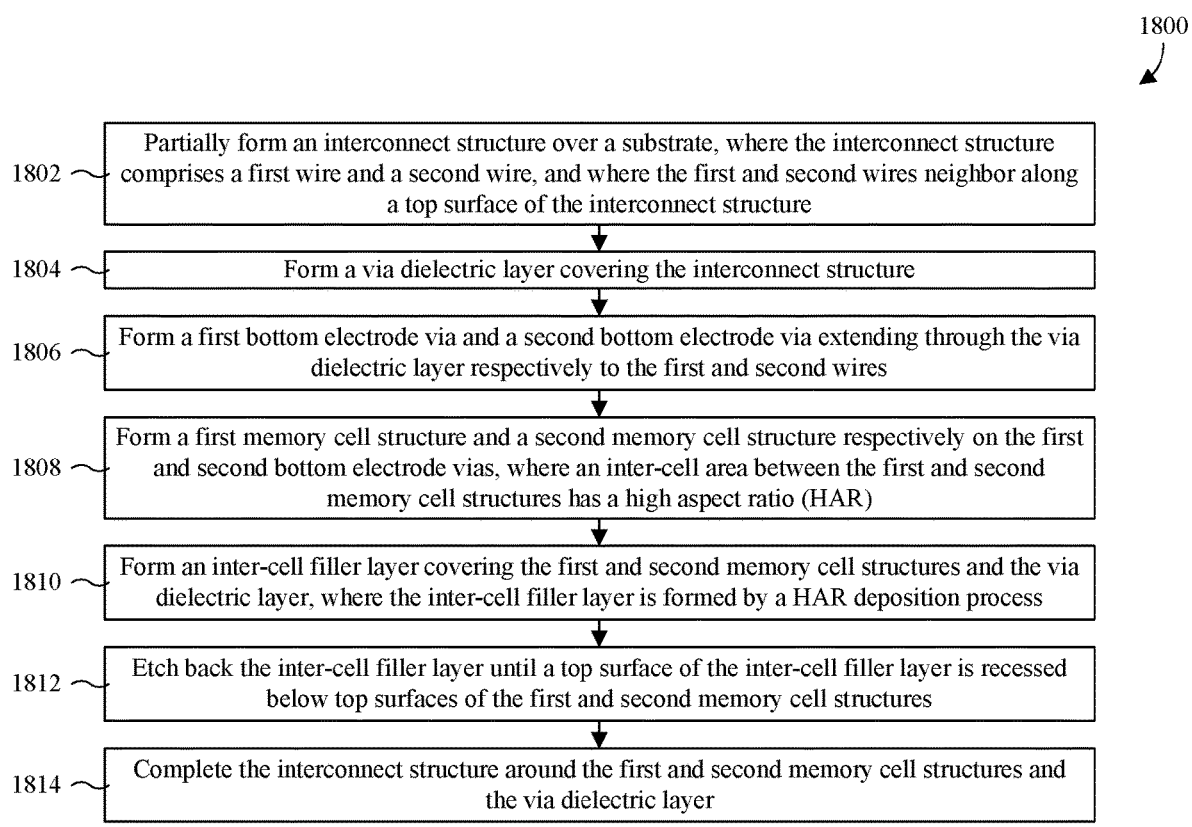
FIG. 18 illustrates a block diagram of some embodiments of the method of FIGS. 7-17.

With reference to FIG. 18, a block diagram 1800 of some embodiments of the method of FIGS. 7-17 is provided.

At 1802, an interconnect structure is partially formed over a substrate, where the interconnect structure comprises a first wire and a second wire, and where the first and second wires neighbor along a top surface of the interconnect structure. See, for example, FIG. 7.

At 1804, a via dielectric layer is formed covering the interconnect structure. See, for example, FIG. 7.

At 1806, a first bottom electrode via and a second bottom electrode via are formed extending through the via dielectric layer respectively to the first and second wires. See, for example, FIG. 8.

At 1808, a first memory cell structure and a second memory cell structure are respectively formed on the first and second bottom electrode vias, where an inter-cell area between the first and second memory cell structures has a HAR. See, for example, FIG. 9. In alternative embodiments, the first and second memory cell structures are formed respectively integrated with the first and second bottom electrode vias. Non-limiting examples of such integrated are illustrated in FIGS. 3D and 3D.

At 1810, an inter-cell filler layer is formed covering the first and second memory cell structures and the via dielectric layer, where the inter-cell filler layer is formed by a HAR deposition process. See, for example, FIG. 10. The HAR deposition process may, for example, be or comprise a SA-CVD process using TEOS and ozone precursors, a HDP-CVD process, an HDR-CVD process using a TEOS precursor, some other suitable HAR and/or HDR deposition process, or any combination of the foregoing.

At 1812, the inter-cell filler layer is etched back until a top surface of the inter-cell filler layer is recessed below top surfaces of the first and second memory cell structures. See, for example, FIG. 11. In alternative embodiments, a planarization is performed into a top surface of the inter-cell filler layer between the acts at 1810 and 1812 and/or the etch back is omitted.

At 1814, the interconnect structure is completed around the first and second memory cell structures and the via dielectric layer. See, for example, FIGS. 12-17.

While the block diagram 1800 of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides a method including: forming a pair of memory cell structures on a via dielectric layer, wherein the memory cell structures are separated by an inter-cell area; depositing an inter-cell filler layer covering the memory cell structures and the via dielectric layer, and further filling the inter-cell area; recessing the inter-cell filler layer until a top surface of the inter-cell filler layer is below a top surface of the pair of memory cell structures and the inter-cell area is partially cleared; and depositing an interconnect dielectric layer covering the memory cell structures and the inter-cell filler layer, and further filling a cleared portion of the inter-cell area. In some embodiments, the inter-cell area has a ratio of height to width greater than about 2:1, wherein the inter-cell filler layer and the interconnect dielectric layer form without a void at the inter-cell area. In some embodiments, the inter-cell filler layer is deposited by a SA-CVD process using a TEOS precursor. In some embodiments, the interconnect dielectric layer is deposited at a slower rate than the inter-cell filler layer. In some embodiments, the pair of memory cell structures include a first memory cell structure, wherein the inter-cell filler layer has a first thickness on a first side of the first memory cell structure, and further has a second thickness on a second side of the first memory cell structure, wherein the second side is opposite the first side and faces the inter-cell area, and wherein the second thickness is greater than the first thickness. In some embodiments, the recessing fully removes the inter-cell filler layer from the first side, but not the second side, of the first memory cell structure. In some embodiments, the method further includes depositing an interconnect dielectric liner over the inter-cell filler layer and at a first rate, wherein the interconnect dielectric layer is deposited over the interconnect dielectric liner, wherein the inter-cell filler layer is deposited at a second rate greater than the first rate, and wherein the interconnect dielectric liner and the inter-cell filler layer include the same material. In some embodiments, the pair of memory cell structures include a first memory cell structure, wherein the method further includes: forming a conductive line and a via overlying the first memory cell structure and inset into the interconnect dielectric layer, wherein the conductive line and the via are formed from a common deposition, and wherein the via extends from the conductive line to the first memory cell structure.

In some embodiments, the present application provides an integrated chip including: a pair of wires; a first memory cell structure and a second memory cell structure over the wires; an inter-cell filler layer separating the first and second memory cell structures and having a top surface recessed below a top surface of the first memory cell structure, wherein the inter-cell filler layer is on a first side of the first memory cell structure facing the second memory cell structure, but is not on a second side of the first memory cell structure opposite the first side; and an interconnect dielectric layer overlying the first and second memory cell structures and the inter-cell filler layer, and further extending towards the top surface of the inter-cell filler layer to below the top surface of the first memory cell structure. In some embodiments, the top surface of the inter-cell filler layer arcs continuously from proximate the first memory cell structure to proximate the second memory cell structure. In some embodiments, the integrated chip further includes an array of memory cell structures, wherein the array includes the first and second memory cell structures, and wherein the inter-cell filler layer has a top layout that is grid shaped and terminates at edges of the array. In some embodiments, the integrated chip further includes: a conductive line overlying the first memory cell structure and sunken into the interconnect dielectric layer; and a via within the interconnect dielectric layer and extending from the conductive line to the first memory cell structure. In some embodiments, the conductive line overlies the second memory cell structure, wherein the conductive line has a downward protrusion laterally between the first and second memory cell structures. In some embodiments, the inter-cell filler layer includes TEOS oxide, wherein the interconnect dielectric layer includes a dielectric material having a dielectric constant less than about 2.0. In some embodiments, the first and second memory cell structures have a height and are separated by a separation amount, wherein a ratio of the height to the separation amount is greater than about 2.5:1, and wherein the inter-cell filler layer and the interconnect dielectric layer are free of voids laterally between the first and second memory cell structures.

In some embodiments, the present application provides another integrated chip including: a pair of wires; a first memory cell structure and a second memory cell structure overlying the wires; an inter-cell filler layer overlying the first and second memory cell structures and filling an inter-cell area directly between the first and second memory cell structures, wherein the inter-cell filler layer has a greater thickness at the inter-cell area than atop the first and second memory cell structures; an interconnect dielectric layer overlying the inter-cell filler layer, wherein the interconnect dielectric layer has a dielectric constant less than that of the inter-cell filler layer; a conductive line inset into the interconnect dielectric layer; and a via extending from the conductive line, through the inter-cell filler layer, to the first memory cell structure. In some embodiments, the conductive line overlies the second memory cell structure, wherein the inter-cell filler layer has a top surface that is indented laterally between the first and second memory cell structures. In some embodiments, the conductive line overlies the second memory cell structure, wherein the inter-cell filler layer has a top surface that is substantially planar from directly over the first memory cell structure to directly over the second memory cell structure. In some embodiments, a top surface of the via is elevated above a top surface of the inter-cell filler layer. In some embodiments, the inter-cell filler layer includes TEOS oxide, wherein the interconnect dielectric layer includes a dielectric material having a dielectric constant less than about 2.5.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a pair of wires;
   a first memory cell structure and a second memory cell structure over the wires;
   an inter-cell filler layer separating the first and second memory cell structures and having a top surface recessed below a top surface of the first memory cell structure, wherein the inter-cell filler layer is on a first side of the first memory cell structure facing the second memory cell structure, but is not on a second side of the first memory cell structure opposite the first side; and
   an interconnect dielectric layer overlying the first and second memory cell structures and the inter-cell filler layer, and further extending towards the top surface of the inter-cell filler layer to below the top surface of the first memory cell structure.

2. The integrated chip according to claim 1, wherein the top surface of the inter-cell filler layer arcs continuously from proximate the first memory cell structure to proximate the second memory cell structure.

3. The integrated chip according to claim 1, further comprising:
   an array of memory cell structures, wherein the array comprises the first and second memory cell structures, and wherein the inter-cell filler layer has a top layout that is grid shaped and terminates at edges of the array.

4. The integrated chip according to claim 1, further comprising:
   a conductive line overlying the first memory cell structure and sunken into the interconnect dielectric layer; and
   a via within the interconnect dielectric layer and extending from the conductive line to the first memory cell structure.

5. The integrated chip according to claim 4, wherein the conductive line overlies the second memory cell structure, and wherein the conductive line has a downward protrusion laterally between the first and second memory cell structures.

6. The integrated chip according to claim 1, wherein the inter-cell filler layer comprises tetraethyl orthosilicate (TEOS) oxide, and wherein the interconnect dielectric layer comprises a dielectric material having a dielectric constant less than about 2.0.

7. The integrated chip according to claim 1, wherein the first and second memory cell structures have a height and are separated by a separation amount, wherein a ratio of the height to the separation amount is greater than about 2.5:1, and wherein the inter-cell filler layer and the interconnect dielectric layer are free of voids laterally between the first and second memory cell structures.

8. An integrated chip comprising:
   a pair of wires;
   a first memory cell structure and a second memory cell structure overlying the wires;
   an inter-cell filler layer overlying the first and second memory cell structures and filling an inter-cell area directly between the first and second memory cell structures, wherein the inter-cell filler layer has a greater thickness at the inter-cell area than atop the first and second memory cell structures;
   an interconnect dielectric layer overlying the inter-cell filler layer, wherein the interconnect dielectric layer has a dielectric constant less than that of the inter-cell filler layer;
   a conductive line inset into the interconnect dielectric layer; and
   a via extending from the conductive line, through the inter-cell filler layer, to the first memory cell structure.

9. The integrated chip according to claim 8, wherein the conductive line overlies the second memory cell structure, and wherein the inter-cell filler layer has a top surface that is indented laterally between the first and second memory cell structures.

10. The integrated chip according to claim 8, wherein the conductive line overlies the second memory cell structure, and wherein the inter-cell filler layer has a top surface that is substantially planar from directly over the first memory cell structure to directly over the second memory cell structure.

11. The integrated chip according to claim 8, wherein a top surface of the via is elevated above a top surface of the inter-cell filler layer.

12. The integrated chip according to claim 8, wherein the inter-cell filler layer comprises tetraethyl orthosilicate (TEOS) oxide, and wherein the interconnect dielectric layer comprises a dielectric material having a dielectric constant less than about 2.5.

13. An integrated chip comprising:
   a lower wire;
   a via dielectric layer overlying the lower wire;
   a first memory cell and a second memory cell overlying the via dielectric layer and bordering, wherein the first memory cell comprises a data storage layer;
   a lower via extending from the first memory cell to the lower wire;
   a gap-fill dielectric layer laterally separating the first and second memory cells, wherein a height of the gap-fill dielectric layer extends vertically from a first elevation to a second elevation at a center between the first and second memory cells;
   an interconnect dielectric layer overlying the first and second memory cells and the gap-fill dielectric layer, wherein the interconnect dielectric layer has a low dielectric constant relative to the gap-fill dielectric layer;
   an upper wire inset into a top surface of the interconnect dielectric layer and having a bottom surface elevated above a top surface of the gap-fill dielectric layer; and
   an upper via extending from the upper wire to the first memory cell;
   wherein the data storage layer has a sidewall facing the gap-fill dielectric layer, and wherein the first and second elevations are respectively above a top edge of the sidewall and below a bottom edge of the sidewall.

14. The integrated chip according to claim 13, wherein the top surface of the gap-fill dielectric layer is completely recessed relative to a top surface of the first memory cell.

15. The integrated chip according to claim 13, wherein the gap-fill dielectric layer overlies the first and second memory cells, and wherein the upper via laterally and directly contacts both the interconnect dielectric layer and the gap-fill dielectric layer.

16. The integrated chip according to claim 15, wherein the top surface of the gap-fill dielectric layer is substantially planar.

17. The integrated chip according to claim 13, wherein the gap-fill dielectric layer has a first sidewall and a second sidewall respectively bordering the first and second memory cells, and wherein the height increases continuously from the center to a bottom edge of each of the first and second sidewalls.

18. The integrated chip according to claim 17, wherein the height decreases continuously from the bottom edge of the first sidewall to a top edge of the first sidewall.

19. The integrated chip according to claim 13, wherein the gap-fill dielectric layer has a first sidewall and a second sidewall respectively bordering the first and second memory cells, and wherein the height is uniform from the center to a bottom edge of each of the first and second sidewalls.

20. The integrated chip according to claim 13, further comprising:

an array of memory cells overlying the via dielectric layer, wherein the array includes the first and second memory cells bordering in a row of the array, wherein the array further includes a third memory cell bordering the first memory cell in a column of the array, wherein the gap-fill dielectric layer has a first dimension along the row and directly between the first and second memory cells, wherein the gap-fill dielectric layer has a second dimension along the column and directly between the first and third memory cells, and wherein the second dimension is greater than the first dimension.

* * * * *